(12) United States Patent
Isa

(10) Patent No.: US 11,437,601 B2
(45) Date of Patent: Sep. 6, 2022

(54) MANUFACTURING METHOD OF LIGHT-EMITTING SEMICONDUCTOR DEVICE WITH A PLURALITY OF SPACERS BETWEEN TWO SUBSTRATES

(71) Applicant: Semiconductor Energy Laboratory Co., Ltd., Kanagawa-ken (JP)

(72) Inventor: Toshiyuki Isa, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 200 days.

(21) Appl. No.: 14/804,872

(22) Filed: Jul. 21, 2015

(65) Prior Publication Data

US 2016/0027967 A1 Jan. 28, 2016

(30) Foreign Application Priority Data

Jul. 25, 2014 (JP) .............................. JP2014-151604

(51) Int. Cl.
*H01L 51/52* (2006.01)
*H01L 27/32* (2006.01)

(52) U.S. Cl.
CPC ........ *H01L 51/525* (2013.01); *H01L 27/3276* (2013.01); *H01L 27/322* (2013.01); *H01L 27/323* (2013.01); *H01L 27/3246* (2013.01); *H01L 51/5246* (2013.01); *H01L 2227/323* (2013.01); *H01L 2227/326* (2013.01)

(58) Field of Classification Search
CPC ... H01L 51/525; H01L 24/00; H01L 25/0753; H01L 27/04; H01L 33/00; H01L 25/0657; H01L 25/074; H01L 27/3276; H01L 27/322; H01L 2227/323; H01L 2227/326; H01L 27/323; H01L 27/3246; H01L 51/5246; H01L 2224/73253
See application file for complete search history.

(56) References Cited

U.S. PATENT DOCUMENTS

| | | | | |
|---|---|---|---|---|
| 6,004,423 | A | * | 12/1999 | Ruedin ................ G02F 1/1339 156/292 |
| 6,638,781 | B1 | | 10/2003 | Hirakata et al. |
| 6,992,439 | B2 | | 1/2006 | Yamazaki et al. |
| 7,196,465 | B2 | | 3/2007 | Park et al. |
| 7,662,011 | B2 | | 2/2010 | Yamazaki et al. |

(Continued)

FOREIGN PATENT DOCUMENTS

| | | |
|---|---|---|
| CN | 001638556 A | 7/2005 |
| EP | 2 306 545 A1 | 4/2011 |

(Continued)

OTHER PUBLICATIONS

Translation of JP2011053582 (Year: 2011).*

*Primary Examiner* — M. A. Golub-Miller
(74) *Attorney, Agent, or Firm* — Husch Blackwell LLP

(57) ABSTRACT

A novel stacked structure that is highly convenient or reliable is provided. A method for manufacturing a novel stacked structure that is highly convenient or reliable is also provided. Furthermore, a novel semiconductor device is provided. The stacked structure includes first to fifth regions in this order. Each of the first to fifth regions includes a first base and a second base. The first region, the third region, and the fifth region each include a spacer that makes a predetermined distance between the first base and the second base.

12 Claims, 7 Drawing Sheets

(56) References Cited

U.S. PATENT DOCUMENTS

| | | | |
|---|---|---|---|
| 7,753,751 B2 | 7/2010 | Yamazaki | |
| 8,232,575 B2 | 7/2012 | Lee et al. | |
| 8,237,355 B2 | 8/2012 | Yamazaki | |
| 8,294,742 B2* | 10/2012 | Itou | B41J 2/44 |
| | | | 347/130 |
| 8,786,178 B2 | 7/2014 | Yamazaki | |
| 8,842,254 B2* | 9/2014 | Kaneko | G02F 1/13452 |
| | | | 349/187 |
| 8,847,485 B2 | 9/2014 | Lee et al. | |
| 8,854,591 B2* | 10/2014 | Liu | G02F 1/1333 |
| | | | 349/153 |
| 9,147,713 B2 | 9/2015 | Yamazaki | |
| 9,281,494 B2 | 3/2016 | Lee et al. | |
| 9,477,109 B2* | 10/2016 | Huh | G02F 1/133351 |
| 9,530,829 B2 | 12/2016 | Yamazaki | |
| 9,651,806 B2 | 5/2017 | Senokuchi et al. | |
| 9,893,130 B2 | 2/2018 | Yamazaki | |
| 10,038,040 B2 | 7/2018 | Yamazaki | |
| 2002/0180371 A1 | 12/2002 | Yamazaki et al. | |
| 2003/0218422 A1* | 11/2003 | Park | H01L 51/5246 |
| | | | 313/512 |
| 2005/0140291 A1* | 6/2005 | Hirakata | H01L 51/5237 |
| | | | 313/512 |
| 2006/0135029 A1* | 6/2006 | Harada | H01L 51/5253 |
| | | | 445/25 |
| 2009/0207370 A1* | 8/2009 | Tsuchiya | G02F 1/1339 |
| | | | 349/153 |
| 2010/0097560 A1* | 4/2010 | Ikeguchi | G02F 1/1339 |
| | | | 349/155 |
| 2011/0285955 A1 | 11/2011 | Nagasawa | |
| 2012/0068370 A1* | 3/2012 | Saruya | B29C 43/18 |
| | | | 264/1.36 |
| 2012/0196499 A1* | 8/2012 | Wang | G02F 1/1303 |
| | | | 445/25 |
| 2012/0217516 A1 | 8/2012 | Hatano et al. | |
| 2012/0235170 A1* | 9/2012 | Lee | C23C 14/042 |
| | | | 257/88 |
| 2012/0286312 A1 | 11/2012 | Hatano et al. | |
| 2013/0149802 A1* | 6/2013 | Kataoka | G02F 1/133351 |
| | | | 438/26 |
| 2013/0264703 A1* | 10/2013 | Tae | H01L 23/49811 |
| | | | 257/737 |
| 2014/0291648 A1* | 10/2014 | Yamazaki | H01L 51/525 |
| | | | 257/40 |
| 2015/0084055 A1* | 3/2015 | Nagata | H01L 51/5246 |
| | | | 257/72 |
| 2015/0194636 A1* | 7/2015 | Okumura | H01L 51/56 |
| | | | 438/34 |
| 2016/0126492 A1* | 5/2016 | Kyoung | H01L 51/5243 |
| | | | 257/40 |
| 2018/0233697 A1* | 8/2018 | Jo | H01L 51/5246 |
| 2018/0350887 A1 | 12/2018 | Yamazaki | |

FOREIGN PATENT DOCUMENTS

| | | |
|---|---|---|
| EP | 2 413 394 A2 | 2/2012 |
| JP | 2002-324666 A | 11/2002 |
| JP | 2006-252988 A | 9/2006 |
| JP | 2007-042467 A | 2/2007 |
| JP | 2007-095611 A | 4/2007 |
| JP | 2009-134984 A | 6/2009 |
| JP | 2009-146733 A | 7/2009 |
| JP | 2011-018647 A | 1/2011 |
| JP | 2011-053339 A | 3/2011 |
| JP | 2011-053582 A | 3/2011 |
| JP | 2011-242705 A | 12/2011 |
| JP | 2012-151124 A | 8/2012 |
| JP | 2012-190794 A | 10/2012 |
| JP | 2013-254056 A | 12/2013 |
| TW | 201205801 | 2/2012 |
| TW | 201218287 | 5/2012 |
| WO | WO 2014/024455 A1 | 2/2014 |

* cited by examiner

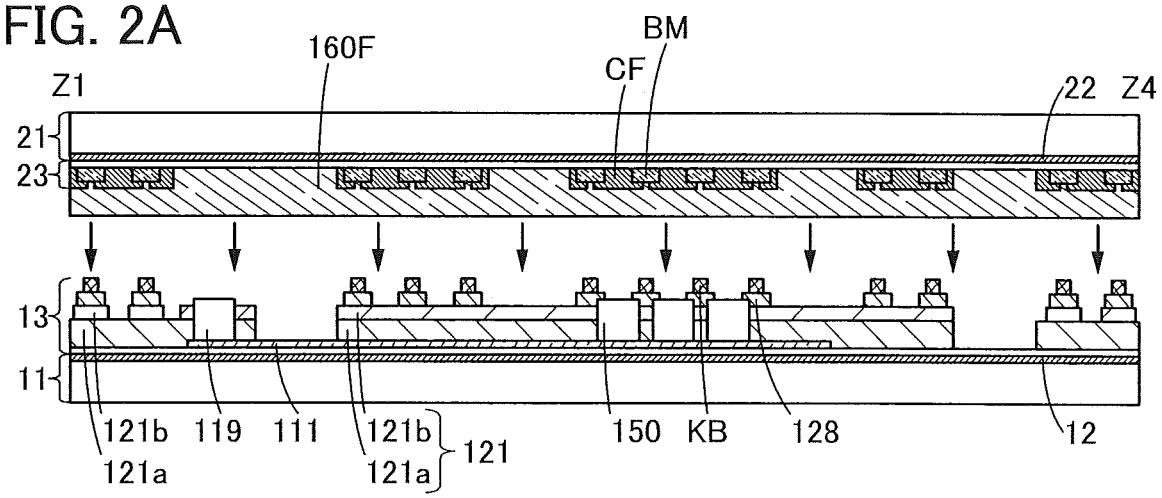
FIG. 2A
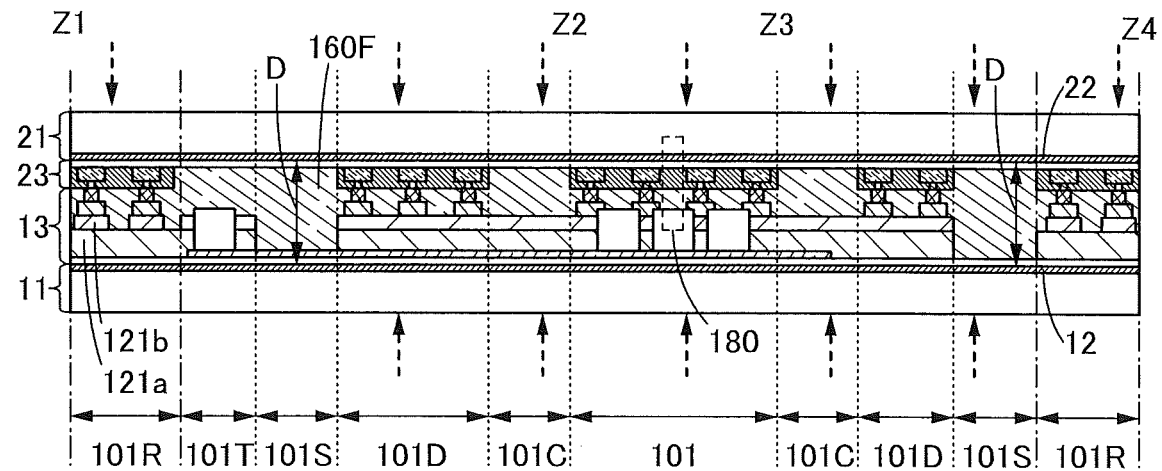
FIG. 2B
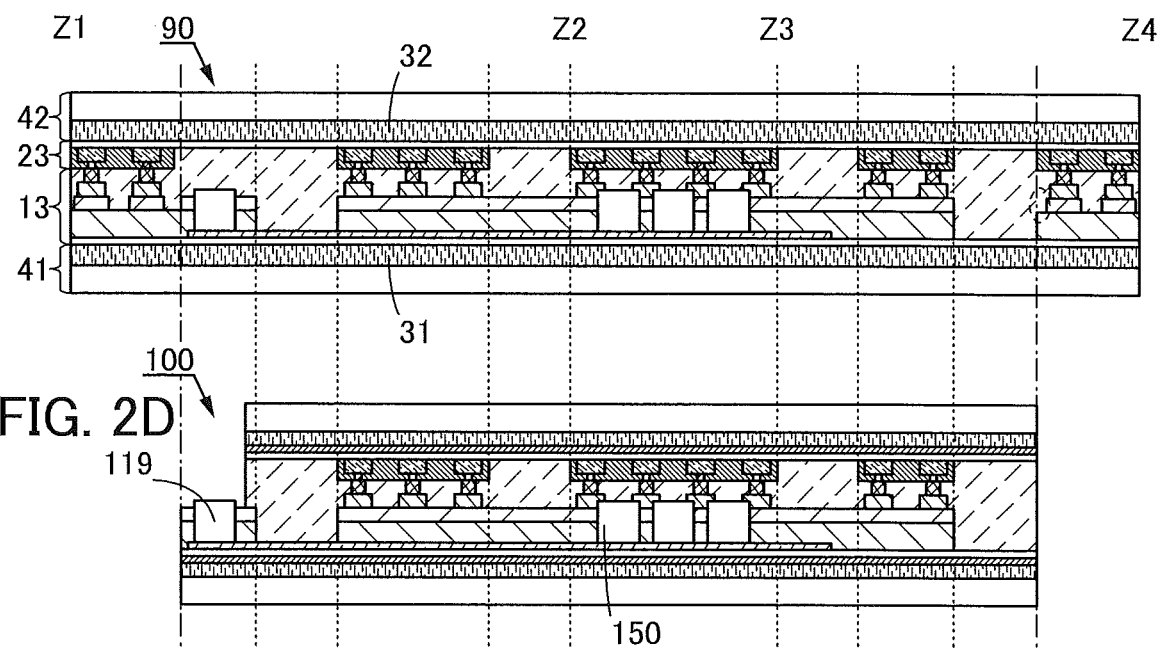
FIG. 2C
FIG. 2D

FIG. 7A1 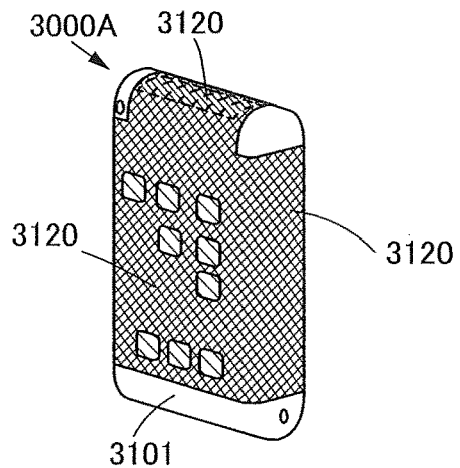
FIG. 7A2 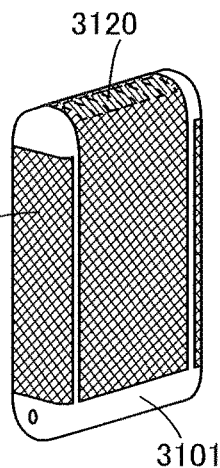
FIG. 7A3 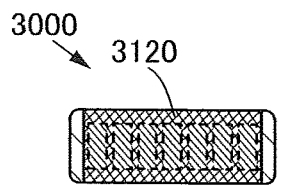
FIG. 7B1 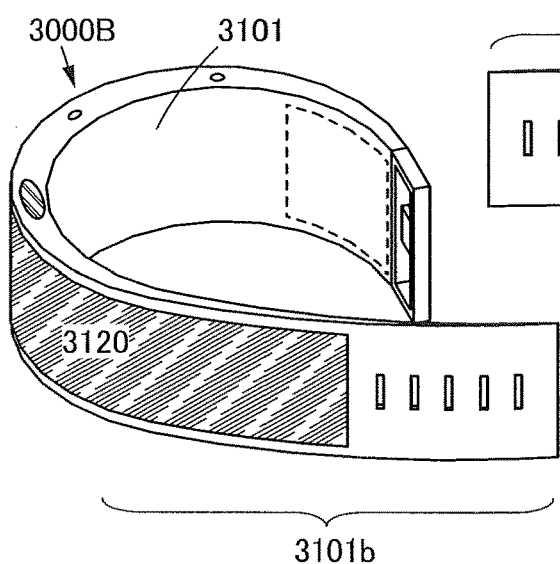
FIG. 7B2 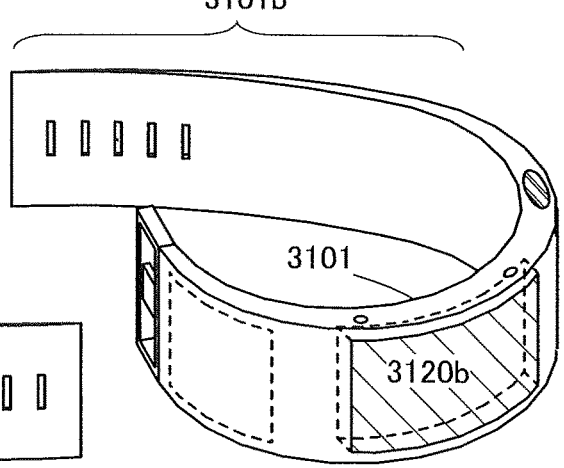
FIG. 7C1 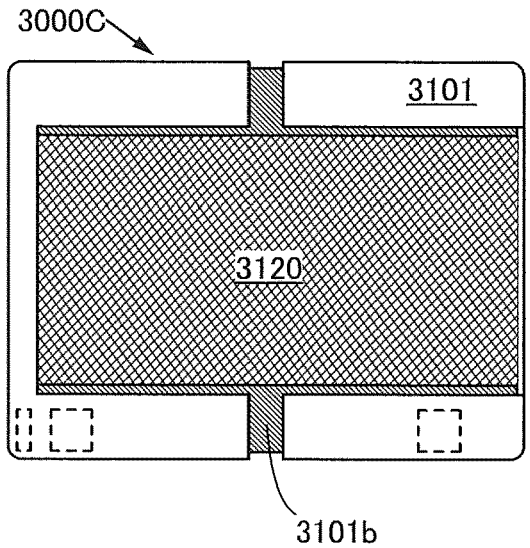
FIG. 7C2 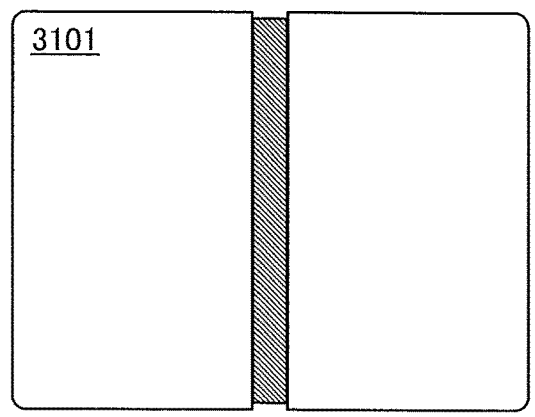

MANUFACTURING METHOD OF LIGHT-EMITTING SEMICONDUCTOR DEVICE WITH A PLURALITY OF SPACERS BETWEEN TWO SUBSTRATES

BACKGROUND OF THE INVENTION

1. Field of the Invention

One embodiment of the present invention relates to a stacked structure, an input/output device, an information processing device, or a manufacturing method of the stacked structure.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Display devices with large screens can display many pieces of information. Therefore, such display devices are excellent in browsability and suitable for information processing devices.

The social infrastructures for transmitting information have advanced. This has made it possible to acquire, process, and transmit a wide variety of information with the use of an information processing device not only at home or office but also away from home or office. With this situation, portable information processing devices are under active development.

Because portable information processing devices are often used outdoors, force might be accidentally applied by dropping to the information processing devices and display devices included in them. A known example of a display device that is not easily broken is a display device having high adhesiveness between a structure body by which a light-emitting layer is divided and a second electrode layer (Patent Document 1).

REFERENCE

Patent Document

[Patent Document 1] Japanese Published Patent Application No. 2012-190794

SUMMARY OF THE INVENTION

An object of one embodiment of the present invention is to provide a novel stacked structure that is highly convenient or reliable. Another object of one embodiment of the present invention is to provide a method for manufacturing a novel stacked structure that is highly convenient or reliable. Another object of one embodiment of the present invention is to provide a novel stacked structure, a method for manufacturing a novel stacked structure, a novel display device, or a novel semiconductor device.

Note that the description of these objects does not disturb the existence of other objects. Note that in one embodiment of the present invention, there is no need to achieve all the objects. Other objects are apparent from and can be derived from the description of the specification, the drawings, the claims, and the like.

One embodiment of the present invention is a stacked structure including a first region, a second region on the outer side of the first region, a third region on the outer side of the second region, a fourth region on the outer side of the third region, and a fifth region on the outer side of the fourth region.

The first to fifth regions include a first base and a second base overlapping with the first base.

The first region, the third region, and the fifth region each include a spacer between the first base and the second base.

The fourth region includes a bonding layer, and the bonding layer attaches the first base and the second base.

One embodiment of the present invention is the aforementioned stacked structure in which the spacer has a size that enables a predetermined distance to be made between the first base and the second base in the first region, the third region, and the fifth region.

The stacked structure of one embodiment of the present invention includes the first to fifth regions in this order from the first region. Each of the first to fifth regions includes the first base and the second base. The first region, the third region, and the fifth region each include the spacer that makes a predetermined distance between the first base and the second base. Consequently, the predetermined distance can be made between the first base and the second base without providing a spacer in the second region and the fourth region. As a result, a novel stacked structure that is highly convenient or reliable can be provided.

One embodiment of the present invention is the aforementioned stacked structure in which the bonding layer in the fourth region has a shape surrounding the first region and is in contact with the first base and the second base.

The stacked structure of one embodiment of the present invention includes the fourth region in which the bonding layer is in contact with the first base and the second base. Consequently, the bonding layer prevents impurities from diffusing to the third region through the fourth region. As a result, a novel stacked structure that is highly convenient or reliable can be provided.

One embodiment of the present invention is the aforementioned stacked structure in which the first to fifth regions include a bonding layer between the first base and the second base.

In addition, in one embodiment of the present invention, the first to third regions include an insulating layer between the first base and the spacer.

The fifth region includes an insulating layer between the first base and the spacer. Furthermore, in the aforementioned stacked structure, the insulating layer in the fifth region includes, in a part that does not overlap with the spacer, an area thinner than a part overlapping with the spacer.

In the stacked structure of one embodiment of the present invention, the fifth region includes the insulating layer part of which is thinner than the part overlapping with the spacer. Hence, the distance can be increased in the part that does not overlap with the spacer. For example, the distance between the insulating layer and a second layer to be separated can be increased. A material can move easily in a region with the increased distance, which makes it easy to set the distance between the first base and the second base to a predetermined length in the formation of the bonding layer. As a result, a novel stacked structure that is highly convenient or reliable can be provided.

One embodiment of the present invention is the aforementioned stacked structure including a sixth region positioned between the fourth region and the fifth region. The first region includes a light-emitting element. The first to fourth regions and the sixth region include a wiring electrically connected to the light-emitting element. The first to third regions include an insulating layer in contact with the wiring. The sixth region includes a terminal electrically connected to the wiring.

In the stacked structure of one embodiment of the present invention, the first region includes the light-emitting element, the first to fourth regions and the sixth region include the wiring electrically connected to the light-emitting element, and the sixth region includes the terminal electrically connected to the wiring. Consequently, the light-emitting element in the first region can be electrically connected to the terminal in the sixth region with the wiring. As a result, a novel stacked structure that is highly convenient or reliable can be provided.

One embodiment of the present invention is a method for manufacturing a stacked structure including the following four steps.

In a first step, a first base on which a spacer is formed, and a second base are prepared. Then, a bonding layer having fluidity is formed on the first base and/or the second base.

In a second step, the first base and the second base are arranged with the spacer and the bonding layer interposed therebetween in a reduced-pressure environment.

In a third step, the pressure in the environment is increased to the atmospheric pressure so that the bonding layer is expanded between the first base, the second base, and the spacer.

In a fourth step, the bonding layer is cured.

The manufacturing method of the stacked structure of one embodiment of the present invention includes the step of increasing the pressure in an environment to the atmospheric pressure, thereby expanding the bonding layer having fluidity between the first base, the second base, and the spacer. Therefore, the first base and the second base can be attached to each other with a predetermined distance therebetween with use of the bonding layer. As a result, it is possible to provide a method for manufacturing a novel stacked structure that is highly convenient or reliable.

Note that in this specification, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

A light-emitting device includes the following in its category: a module to which a connector such as a flexible printed circuit (FPC) or a tape carrier package (TCP) is attached; a module having a TCP provided with a printed wiring board at the end thereof; and a substrate over which an integrated circuit (IC) is mounted by a chip on glass (COG) method and a light-emitting element is formed.

Furthermore, in this specification, one of a first electrode and a second electrode of a transistor refers to a source electrode and the other refers to a drain electrode.

According to one embodiment of the present invention, a novel stacked structure that is highly convenient or reliable can be provided. According to another embodiment of the present invention, a method for manufacturing a novel stacked structure that is highly convenient or reliable can be provided. According to another embodiment of the present invention, a novel display device, a novel semiconductor device, or the like can be provided. According to another embodiment of the present invention, a novel input/output device that is highly convenient or reliable can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 2A to 2D illustrate a method for manufacturing a stacked structure of one embodiment;

FIGS. 7A1, 7A2, 7A3, 7B1, 7B2, 7C1, and 7C2 illustrate structures of information processing devices of one embodiment.

DETAILED DESCRIPTION OF THE INVENTION

Figure 1A:
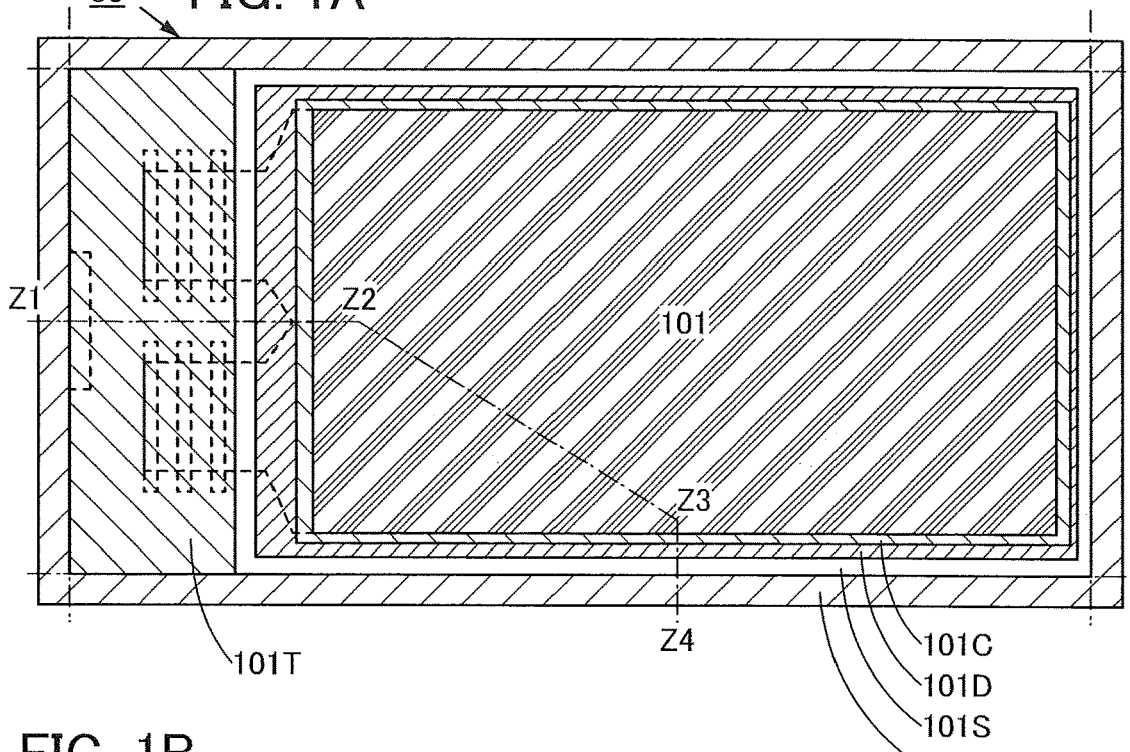
FIGS. 1A to 1D illustrate a structure of a stacked structure of one embodiment.

A stacked structure of one embodiment of the present invention includes first to fifth regions in this order from the first region. Each of the first to fifth regions includes a first base and a second base. The first region, the third region, and the fifth region each include a spacer that makes a predetermined distance between the first base and the second base.

Consequently, the predetermined distance can be made between the first base and the second base without providing a spacer in the second region and the fourth region. As a result, a novel stacked structure that is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a structure of a stacked structure of one embodiment of the present invention will be described with reference to FIGS. 1A to 1D.

Figure 1B:
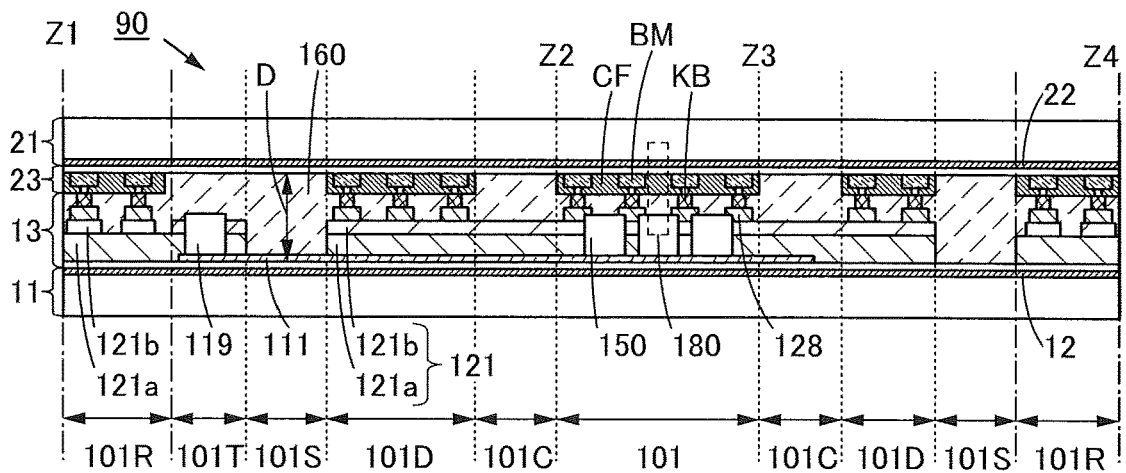
Figure 1C:
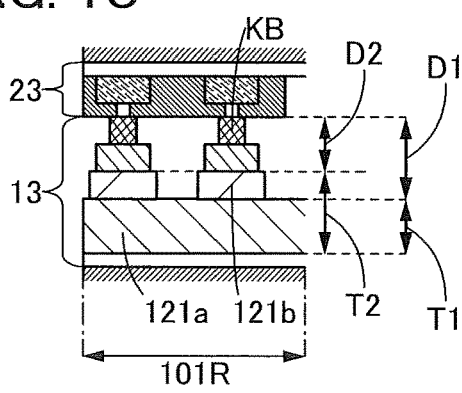
Figure 1D:
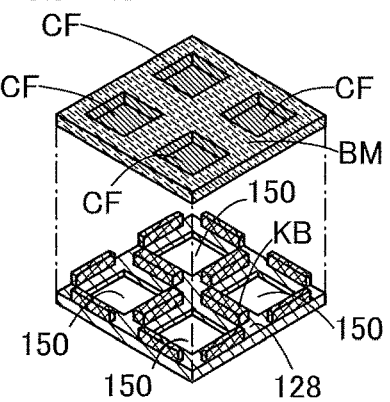

FIGS. 1A to 1D are schematic views illustrating the structure of the stacked structure of one embodiment of the present invention. FIG. 1A is a top view of the stacked structure of one embodiment of the present invention, and FIG. 1B is a cross-sectional view along line Z1-Z2-Z3-Z4 in FIG. 1A. FIG. 1C is an enlarged cross-sectional view of part of FIG. 1B, and FIG. 1D is an enlarged projection view of part of FIG. 1B.

<Structure Example of Stacked Structure>

A stacked structure 90 described in this embodiment includes a first region 101, a second region 101C on the outer side of the first region 101, a third region 101D on the outer side of the second region 101C, a fourth region 101S on the outer side of the third region 101D, and a fifth region 101R on the outer side of the fourth region 101S (see FIG. 1A).

The first region 101 to the fifth region 101R each include a first base 11 and a second base 21 overlapping with the first base 11 (see FIG. 1B).

The first region 101, the third region 101D, and the fifth region 101R each include a spacer KB between the first base 11 and the second base 21.

The fourth region 101S includes a bonding layer 160. With the bonding layer 160, the first base 11 is attached to the second base 21.

The spacer KB in the stacked structure 90 of one embodiment of the present invention has a size that enables a predetermined distance D to be made between the first base 11 and the second base 21 in the first region 101, the third region 101D, and the fifth region 101R.

The stacked structure 90 described in this embodiment includes the first region 101 to the fifth region 101R in ascending order from the first region 101. The first region 101 to the fifth region 101R each include the first base 11 and the second base 21. The first region 101, the third region 101D, and the fifth region 101R each include, between the first base 11 and the second base 21, the spacer KB that makes the predetermined distance D. Consequently, the predetermined distance can be made between the first base and the second base without providing a spacer in the second region and the fourth region. As a result, a novel stacked structure that is highly convenient or reliable can be provided.

Furthermore, the fourth region 101S in the stacked structure 90 of one embodiment of the present invention surrounds the first region 101 and includes the bonding layer 160 in contact with the first base 11 and the second base 21 (see FIGS. 1A and 1B).

The fourth region 101S in the stacked structure 90 of one embodiment of the present invention includes the bonding layer 160 in contact with the first base 11 and the second base 21. Consequently, the bonding layer prevents impurities from diffusing to the third region through the fourth region. As a result, a novel stacked structure that is highly convenient or reliable can be provided.

The first region 101 to the fifth region 101R in the stacked structure 90 of one embodiment of the present invention also include the bonding layer 160 between the first base 11 and the second base 21.

In addition, the first region 101 and the third region 101D in the stacked structure 90 of one embodiment of the present invention include an insulating layer 121 between the first base 11 and the spacer KB. For example, the insulating layer 121 includes a first insulating layer 121a and a second insulating layer 121b.

The fifth region 101R includes the insulating layer 121 between the first base 11 and the spacer KB. The insulating layer 121 in the fifth region 101R includes, in a part that does not overlap with the spacer KB, an area thinner than a part overlapping with the spacer KB.

For example, the part overlapping with the spacer KB includes the first insulating layer 121a and the second insulating layer 121b, and the part that does not overlap with the spacer KB includes the first insulating layer 121a.

The fifth region 101R in the stacked structure 90 of one embodiment of the present invention includes the insulating layer 121 part of which is thinner than the part overlapping with the spacer KB. Hence, the distance can be increased in the part that does not overlap with the spacer KB. For example, the distance between the insulating layer 121 and a second layer to be separated 23 can be increased. A material can move easily in a region with the increased distance, which makes it easy to set the distance between the first base 11 and the second base 21 to a predetermined length in the formation of the bonding layer 160. As a result, a novel stacked structure that is highly convenient or reliable can be provided.

Moreover, the stacked structure 90 of one embodiment of the present invention includes a sixth region 101T positioned between the fourth region 101S and the fifth region 101R.

The first region 101 includes a light-emitting element 150.

The first region 101 to the fourth region 101S and the sixth region 101T include a wiring 111 electrically connected to the light-emitting element 150.

The first region 101 to the third region 101D include the insulating layer 121 in contact with the wiring 111.

The sixth region 101T includes a terminal 119 electrically connected to the wiring 111.

In the stacked structure 90 described in this embodiment, the first region 101 includes the light-emitting element 150, the first region 101 to the fourth region 101S and the sixth region 101T include the wiring 111 electrically connected to the light-emitting element 150, and the sixth region 101T includes the terminal 119 electrically connected to the wiring 111. Consequently, the light-emitting element 150 in the first region can be electrically connected to the terminal 119 in the sixth region with the wiring 111. As a result, a novel stacked structure that is highly convenient or reliable can be provided.

In addition, the stacked structure 90 includes a component between the spacer KB and the second base 21.

Examples of the component include a coloring layer CF and a light-blocking layer BM (see FIGS. 1B and 1D).

The stacked structure 90 also includes another component between the spacer KB and the insulating layer 121. An example of the component includes a partition 128 having an opening.

Moreover, the stacked structure 90 has the predetermined distance D between the first base 11 and the second base 21.

The insulating layer 121, the partition 128, the spacer KB, the coloring layer CF, and the light-blocking layer BM are stacked in this order and fit in the predetermined distance D.

Furthermore, the stacked structure 90 includes a functional element in a position that does not overlap with the spacer KB.

For example, the light-emitting element 150 can be used as the functional element. Note that the coloring layer CF may be provided to overlap with the light-emitting element 150 so that a light-emitting module 180 is obtained.

The stacked structure 90 also includes the terminal 119 electrically connected to the functional element.

Individual components of the stacked structure will be described blow. Note that these components cannot be clearly distinguished and one component also serves as another component or includes part of another component in some cases.

For example, the partition 128 overlapped with the spacer KB serves as a spacer as well as a partition.

<<Overall Structure>>

The stacked structure 90 in this embodiment includes the first region 101, the second region 101C, the third region 101D, the fourth region 101S, or the fifth region 101R.

The stacked structure 90 includes the first base 11, the second base 21, or the bonding layer 160.

The stacked structure 90 includes the insulating layer 121, the spacer KB, or various kinds of components.

The stacked structure 90 includes the light-emitting element 150 or the terminal 119.

<<First Region 101>>

The first region 101 includes the first base 11, the second base 21, or the bonding layer 160. Furthermore, the first region 101 has the predetermined distance D between the first base 11 and the second base 21.

The first region 101 includes the insulating layer 121, the spacer KB, various kinds of components, or the light-emitting element 150.

<<Second Region 101C>>

The second region 101C includes the first base 11, the second base 21, or the bonding layer 160.

The second region 101C includes the insulating layer 121 or the bonding layer 160.

<<Third Region 101D>>

The third region 101D includes the first base 11, the second base 21, or the bonding layer 160. Furthermore, the third region 101D has the predetermined distance D between the first base 11 and the second base 21.

The third region 101D includes the insulating layer 121 or the spacer KB.

<<Fourth Region 101S>>

The fourth region 101S includes the first base 11, the second base 21, or the bonding layer 160. Furthermore, in the fourth region 101S, the bonding layer 160 is in contact with the first base 11 and the second base 21.

The fourth region 101S surrounds the first region 101.

<<Fifth Region 101R>>

The fifth region 101R includes the first base 11, the second base 21, or the bonding layer 160. Furthermore, the fifth region 101R has the predetermined distance D between the first base 11 and the second base 21.

The fifth region 101R includes the insulating layer 121 or the spacer KB.

The insulating layer 121 in the fifth region 101R includes, in a part that does not overlap with the spacer KB, an area thinner than a part overlapping with the spacer KB.

<<First Base 11>>

The first base 11 has heat resistance high enough to withstand a manufacturing process and a thickness and a size which can be used in a manufacturing apparatus.

For example, an organic material or an inorganic material can be used for the first base 11.

For example, an organic material such as a resin, a resin film, or plastic can be used for the first base 11. Specifically, a thin film or plate containing polyester, polyolefin, polyamide, polyimide, polycarbonate, or an acrylic resin can be used.

For example, an inorganic material such as glass, ceramic, or metal can be used for the first base 11. Specifically, a plate containing non-alkali glass, soda-lime glass, potash glass, crystal glass, or the like can be used. Specifically, a metal foil or metal plate containing stainless steel (SUS), aluminum, magnesium, or the like can be used.

For example, an inorganic oxide, an inorganic nitride, or an inorganic oxynitride can be used for the first base 11. Specifically, a thin film containing silicon oxide, silicon nitride, silicon oxynitride, alumina, or the like can be used.

For example, a material or a composite material of a plurality of materials can be used for the first base 11. Specifically, it is possible to use a composite material in which a plurality of materials are stacked or a composite material in which a fibrous or particulate material is dispersed in another material.

For example, a material in which a base and an insulating film that prevents diffusion of impurities contained in the base are stacked can be used for the first base 11. Specifically, it is possible to use a material in which glass and one or more of materials that prevent diffusion of impurities contained in the glass, e.g., silicon oxide, silicon nitride, or silicon oxynitride, are stacked. It is also possible to use a material in which a resin and one or more of materials that prevent diffusion of impurities passing through the resin, such as silicon oxide, silicon nitride, and silicon oxynitride, are stacked.

For example, a composite material such as a resin film to which a metal plate, a thin glass plate, or a film of an inorganic material is attached can be used for the first base 11.

For example, one of the surfaces of the first base 11 can be provided with the separation layer 12 that has a function of making it easy to remove a first layer to be separated 13 described later.

<<First Layer to be Separated 13>>

It is possible to use the first layer to be separated 13 that can be removed from the first base 11.

For example, it is possible to use a material in which the first layer to be separated 13 is stacked in contact with the separation layer 12 formed on a surface of the first base 11. This structure enables the first layer to be separated 13 to be removed from the first base 11 in a later process. Specifically, a layer containing tungsten can be used as the separation layer 12, and a layer that is in contact with the layer containing tungsten and contains an inorganic oxide or an inorganic oxynitride can be used as the first layer to be separated 13. With such a structure, the first layer to be separated 13 can be removed from the first base 11. Note that a composite material in which another material is further stacked over the layer containing an inorganic oxide or an inorganic oxynitride can be used for the first layer to be separated 13.

Alternatively, a surface of the first base 11 may include a glass plate, and a layer containing polyimide can be used as the first layer to be separated 13. Specifically, a glass plate is used for the separation layer and a layer containing polyimide in contact with the surface of the glass plate can be used as the first layer to be separated 13. This structure enables the first layer to be separated 13 to be removed from the first base 11 in a later process. Note that a composite material in which another material is further stacked over the layer containing polyimide can be used for the first layer to be separated 13.

<<Second Base 21>>

The second base 21 can be formed using the same material as the first base 11.

In addition, a surface of the second base 21 can be provided with the separation layer 22 that has a function of making it easy to remove the second layer to be separated 23 described later.

<<Second Layer to be Separated 23>>

It is possible to use the second layer to be separated 23 that can be removed from the second base 21. The second layer to be separated 23 can be formed using the same material as the first layer to be separated 13.

For example, it is possible to use the second layer to be separated 23 in contact with the separation layer 22 formed on a surface of the second base 21.

<<Bonding Layer 160>>

The bonding layer 160 has a function of attaching the second base 21 and the first base 11.

An inorganic material, an organic material, a composite material of an inorganic material and an organic material, or the like can be used for the bonding layer 160.

For example, a glass layer with a melting point of 400° C. or lower, preferably 300° C. or lower, or an adhesive can be used as the bonding layer 160.

For example, an organic material such as a light curable adhesive, a reactive curable adhesive, a thermosetting adhesive, and/or an anaerobic adhesive can be used for the bonding layer 160.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the bonding layer 160.

<<Component>>

For example, the insulating layer 121, the coloring layer CF, the light-blocking layer BM, or the partition 128 can be used for a component. Note that the light-blocking layer BM partly overlaps with the partition 128.

Note that the first layer to be separated 13 can include part of the component. Specifically, the first layer to be separated 13 can include the insulating layer 121, the partition 128, the spacer KB, the light-emitting element 150, the wiring 111, and the terminal 119.

In addition, the second layer to be separated 23 can include part of the component. Specifically, the second layer to be separated 23 can include the coloring layer CF and the light-blocking layer BM.

<<Insulating Layer 121>>

For example, an organic material or an inorganic material can be used for the insulating layer 121.

For example, an organic material such as a resin can be used for the insulating layer 121. Specifically, a thin film containing polyester, polyolefin, polyamide, polyimide, polycarbonate, an acrylic resin, or a material containing a photosensitive polymer can be used.

For example, an inorganic oxide, an inorganic nitride, or an inorganic oxynitride can be used for the insulating layer 121. Specifically, a thin film containing silicon oxide, silicon nitride, silicon oxynitride, alumina, or the like can be used.

For example, a material or a composite material of a plurality of materials can be used for the insulating layer 121. Specifically, it is possible to use a composite material in which a plurality of materials are stacked or a composite material in which a fibrous or particulate material is dispersed in another material.

For example, a stack of the insulating layers 121a and 121b can be used as the insulating layer 121. Specifically, a 2-μm-thick acrylic resin can be used for each of the insulating layers 121a and 121b.

Furthermore, the insulating layer 121 does not necessarily have a uniform thickness. For example, the insulating layer 121 can include, in a part that does not overlap with the spacer KB, an area thinner than a part overlapping with the spacer KB. Specifically, the insulating layer 121 in the fifth region 101R has a thickness T2 in the part overlapping with the spacer KB, and a thickness T1 in the part that does not overlap with the spacer KB. Accordingly, a distance D1 longer than a distance D2 is made in the part that does not overlap with the spacer KB.

<<Coloring Layer CF>>

The coloring layer CF has a function of transmitting light of a predetermined color.

For example, a layer transmitting red light, a layer transmitting green light, or a layer transmitting blue light can be used as the coloring layer CF. Alternatively, a layer transmitting yellow light, a layer transmitting cyan light, or a layer transmitting magenta light may be used as the coloring layer CF.

For example, a plurality of coloring layers CF transmitting light of different colors can be selected to be provided. For example, the coloring layers CF may be arranged in a band. Alternatively, the coloring layers CF may be arranged in a checked pattern (see FIG. 1D).

Specifically, a layer transmitting red light, a layer transmitting green light, a layer transmitting blue light, and a layer transmitting yellow light may be provided.

For example, a layer containing a pigment or a dye can be used as the coloring layer CF. Specifically, a polymer containing a pigment or a dye can be used for the coloring layer CF.

<<Light-Blocking Layer BM>>

The light-blocking layer BM has a function of blocking visible light.

The light-blocking layer BM has, for example, a band-like or grid-like shape (see FIG. 1D).

For example, a light-blocking material can be used for the light-blocking layer BM. A resin in which a pigment is dispersed, a resin containing a dye, or an inorganic film such as a black chromium film can be used for the light-blocking layer BM. Specifically, carbon black, an inorganic oxide, a composite oxide containing a solid solution of a plurality of inorganic oxides, or the like can be used.

<<Partition 128>>

The partition 128 includes an opening. For example, the partition 128 can have a band-like or checked opening (see FIG. 1D). Specifically, the partition 128 can have an opening divided into squares.

Note that, for example, a functional element can be provided in the opening.

For example, an insulating organic or inorganic material can be used for the partition 128.

For example, an organic material such as a resin can be used for the partition 128. Specifically, a thin film containing polyester, polyolefin, polyamide, polyimide, polycarbonate, an acrylic resin, or a material containing a photosensitive polymer can be used.

For example, an inorganic oxide, an inorganic nitride, or an inorganic oxynitride can be used for the partition 128. Specifically, a thin film containing silicon oxide, silicon nitride, silicon oxynitride, alumina, or the like can be used.

For example, a material or a composite material of a plurality of materials can be used for the partition 128. Specifically, it is possible to use a composite material in which a plurality of materials are stacked or a composite material in which a fibrous or particulate material is dispersed in another material.

Specifically, a 0.8-μm-thick polyimide can be used for the partition 128.

<<Spacer KB>>

The spacer KB has a size capable of making the predetermined distance D. Note that there is a region where the spacer KB overlaps with the light-blocking layer BM and the partition 128.

For example, an organic material, an inorganic material, or a composite material of an organic material and an inorganic material can be used for the spacer KB.

Specifically, an inorganic oxide, an inorganic nitride, an inorganic oxynitride, or the like can be used for the spacer KB. For example, silicon oxide, silicon nitride, silicon oxynitride, or alumina can be used for the spacer KB.

Specifically, an organic material such as a resin or plastic can be used for the spacer KB. Specifically, polyester, polyolefin, polyamide, polyimide, polycarbonate, an acrylic resin, a material containing a photosensitive polymer, or the like can be used for the spacer KB.

<<Functional Element>>

The stacked structure 90 includes one or more functional elements. For example, the stacked structure 90 may include a plurality of functional elements arranged in a matrix.

For example, an electric element or a biochip can be used as the functional element. Specifically, a transistor, a capacitor, a resistor, a memory element, a light-emitting element, a display element, or the like can be used.

For example, a display element and a pixel circuit for driving the display element can be used as the functional element.

For example, the light-emitting element 150 can be used as the functional element. Specifically, an organic electroluminescent element can be used as the light-emitting element 150.

<<Wiring 111 and Terminal 119>>

The stacked structure 90 includes the wiring 111 and the terminal 119. For example, the terminal 119 is electrically connected to the light-emitting element 150 through the wiring 111.

The wiring 111 and the terminal 119 contain a material having conductivity.

For example, an inorganic conductive material, an organic conductive material, a metal material, or a conductive ceramic material can be used for the terminal 119.

Specifically, a metal element selected from aluminum, gold, platinum, silver, chromium, tantalum, titanium, molybdenum, tungsten, nickel, iron, cobalt, palladium, and manganese; an alloy including any of the above-described metal elements; an alloy including any of the above-described metal elements in combination; or the like can be used for the wiring or the like.

Alternatively, a conductive oxide such as indium oxide, indium tin oxide, indium zinc oxide, zinc oxide, or zinc oxide to which gallium is added can be used.

Alternatively, graphene or graphite can be used. A film containing graphene can be formed, for example, by reducing a film containing graphene oxide. Examples of a reducing method include a method with application of heat and a method using a reducing agent.

Alternatively, a conductive polymer can be used.

Note that this embodiment can be combined with the other embodiments in this specification as appropriate.

Embodiment 2

In this embodiment, a method for manufacturing a stacked structure of one embodiment of the present invention will be described with reference to FIGS. 2A to 2D.

FIGS. 2A to 2D illustrate the method for manufacturing a stacked structure of one embodiment of the present invention. FIG. 2A is a cross-sectional view illustrating a first step of the method for manufacturing the stacked structure 90 of one embodiment of the present invention, and FIG. 2B is a cross-sectional view illustrating second to fourth steps.

<Example of Manufacturing Method of Stacked Structure>

The method for manufacturing the stacked structure described in this embodiment includes the following four steps.

<<First Step>>

In the first step, prepared are the first base 11 on which the first layer to be separated 13 including the spacer KB is formed and the second base 21 on which the second layer to be separated 23 is formed. Then, a bonding layer 160F having fluidity is formed on the first base 11 and/or the second base 21 (see FIG. 2A).

Specifically, a material in which a 0.7-mm-thick glass plate, a 200-nm-thick silicon oxynitride film, a 30-nm-thick tungsten film, and the layer to be separated 13 (or 23) are stacked in this order can be used for the first base 11 and the second base 21.

A film including a material in which a 600-nm-thick silicon oxynitride film and a 200-nm-thick silicon nitride film are stacked in this order from the tungsten film side can be used as the first layer to be separated 13 and the second layer to be separated 23. Alternatively, a film including a material in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film are stacked in this order from the tungsten film side can be used as the first layer to be separated 13 and the second layer to be separated 23. Note that a silicon oxynitride film contains more oxygen than nitrogen, and a silicon nitride oxide film contains more nitrogen than oxygen.

Alternatively, a film in which a 0.7-mm-thick glass plate, a polyimide film, and a film containing silicon oxide, silicon nitride, or the like are stacked in this order can be used for the first base 11 and the second base 21.

In addition, the first layer to be separated 13 can include the insulating layer 121 with a thickness of 4 μm, the partition 128 with a thickness of 0.8 μm, and the spacer KB with a thickness of 0.8 μm. Note that in the fifth region, the 4-μm-thick insulating layer 121 is provided in a part that overlaps with the spacer KB, and the first insulating layer 121a with a thickness of 2 μm is provided in a part that does not overlap with the spacer KB.

Furthermore, the light-blocking layer BM with a thickness of 1 μm and the coloring layer CF with a thickness of greater than or equal to 0.8 μm and less than or equal to 2 μm can be used for the second layer to be separated 23.

The bonding layer 160F having fluidity can be formed by, for example, a screen printing method, an inkjet method, or an application method using a coater.

Specifically, the bonding layer 160F with a thickness of 10 μm including a thermosetting epoxy resin-based adhesive having fluidity is formed by a screen printing method on the side of the second base 21 on which the light-blocking layer BM and the coloring layer CF are provided.

<<Second Step>>

In the second step, the first base 11 and the second base 21 are arranged with the spacer KB and the bonding layer 160F interposed therebetween in a reduced-pressure environment (see FIG. 2B).

For example, the spacer KB and the bonding layer 160F are provided between the first base 11 and the second base 21 in an environment with a pressure reduced to 1 Pa. Note that the pressure in the environment is preferably 1 Pa or less. In that case, the pressure in the environment can be returned to the atmospheric pressure in a later step without bubbles remaining between the first base 11 and the second base 21.

<<Third Step>>

In the third step, the pressure in the environment is increased to the atmospheric pressure so that the bonding layer 160F is expanded between the first base 11, the second base 21, and the spacer KB.

When the pressure in the environment is increased from the reduced pressure to the atmospheric pressure, the second base 21 can be pressed against the first base 11. As a result, the bonding layer 160F having fluidity, which is positioned between the first base 11 and the second base 21, is expanded between the first base 11, the second base 21, and the spacer KB.

Note that the spacer KB has a size that enables the predetermined distance D to be made between the first base 11 and the second base 21.

The bonding layer 160F is less likely to move in a region including a component.

Hence, a part of the insulating layer 121 that does not overlap with the spacer KB is made thinner than another part thereof that overlaps with the spacer KB. This allows the bonding layer 160F to move easily in the part that does not overlap with the spacer KB.

Specifically, the insulating layer 121 in which the first insulating layer 121a and the second insulating layer 121b are stacked is used in the part overlapping with the spacer KB, and the insulating layer 121 including only the first insulating layer 121a is used in the part that does not overlap with the spacer KB.

The spacer KB is not provided in the second region 101C, the fourth region 101S, and the sixth region 101T. With such a structure, a greater force is applied to the spacers KB arranged on an edge of the first region 101 that is adjacent to the second region 101C, an edge of the third region 101D that is adjacent to the second region 101C, an edge of the third region 101D that is adjacent to the fourth region 101S, an edge of the fifth region 101R that is adjacent to the fourth region 101S, and an edge of the fifth region 101R that is adjacent to the sixth region 101T, than to the spacers KB arranged in the other regions.

A force greater than a predetermined force might crush the spacer KB. The crushed spacer KB makes the distance between the first base 11 and the second base 21 smaller than the predetermined distance in some cases. In addition, other components or functional elements around the spacer KB are damaged in some cases. Specifically, the insulating layer 121, the coloring layer CF, the light-blocking layer BM, the partition 128, or the light-emitting element 150 is damaged in some cases.

Thus, the width of a region without the spacer KB is reduced. This results in a reduction in the force applied to the spacer KB adjacent to the region where the spacer KB is not provided.

For example, when the width of the second region 101C is reduced, it is possible to reduce the force applied to the spacer KB arranged on the edge of the first region 101. Specifically, when the width of the second region 101C is reduced to 3 mm or less, preferably 1 mm or less, it is possible to reduce the force applied to the spacer KB arranged on the edge of the first region 101.

<<Fourth Step>>

In the fourth step, the bonding layer 160F is cured.

In the case where, for example, a thermosetting material is used for the bonding layer 160F, the bonding layer 160F is heated, so that the bonding layer 160 is formed.

The manufacturing method of the stacked structure 90 described in this embodiment includes the step of increasing the pressure in an environment to the atmospheric pressure, thereby expanding the bonding layer 160 having fluidity between the first base 11, the second base 21, and the spacer KB. Therefore, the first base and the second base can be attached to each other with a predetermined distance therebetween with use of the bonding layer. As a result, it is possible to provide a method for manufacturing a novel stacked structure that is highly convenient or reliable.

<Example of Manufacturing Method of Light-Emitting Device>

Next, a method for manufacturing a light-emitting device 100 including the stacked structure 90 will be described with reference to FIGS. 2C and 2D.

FIG. 2C is a cross-sectional view illustrating a structure of the stacked structure of one embodiment of the present invention. FIG. 2D is a cross-sectional view illustrating a structure of the light-emitting device of one embodiment of the present invention.

<<Fifth Step>>

In the fifth step, the first layer to be separated 13 is removed from the first base 11. The removed first layer to be separated 13 is attached to a first base 41 with an adhesive layer 31.

Furthermore, the second layer to be separated 23 is removed from the second base 21. The removed second layer to be separated 23 is attached to a second base 42 with an adhesive layer 32 (see FIG. 2C).

Note that a material having flexibility can be used for the first base 41 and the second base 42. In that case, a flexible light-emitting device 100 can be provided. For example, an organic material such as a resin, a resin film, or plastic can be used for the first base 41 and the second base 42. Specifically, polyester, polyolefin, polyamide, polyimide, polycarbonate, an acrylic resin, or the like can be used. Alternatively, an inorganic material such as a metal that does not have light-transmitting properties can be used in the case where light-transmitting properties are not needed. Specifically, SUS, aluminum, or the like can be used.

<<Sixth Step>>

In the sixth step, the fifth region 101R is cut off (see FIG. 2D).

Note that the fourth region 101S has been adjacent to the fifth region 101R including the spacer KB; therefore, the fourth region 101S has the predetermined distance between the first base 41 and the second base 42. This can prevent the spacer KB in the first region 101 and the spacer KB in the third region 101D from being crushed.

<<Seventh Step>>

In the seventh step, the second base 42 and the bonding layer 160 that overlap with the terminal 119 are removed, so that the terminal 119 is exposed.

As a result, power is supplied to the terminal 119 and the terminal 119 can supply power. In addition, the light-emitting element 150 can also be supplied with power.

Note that this embodiment can be combined with the other embodiments in this specification as appropriate.

Embodiment 3

In this embodiment, a structure of an input/output device of one embodiment of the present invention will be described with reference to FIGS. 3A and 3B, FIG. 4, and FIGS. 5A and 5B.

FIGS. 3A and 3B, FIG. 4, and FIGS. 5A and 5B illustrate structures of an input/output device 500TP of one embodiment of the present invention.

Figure 3A:
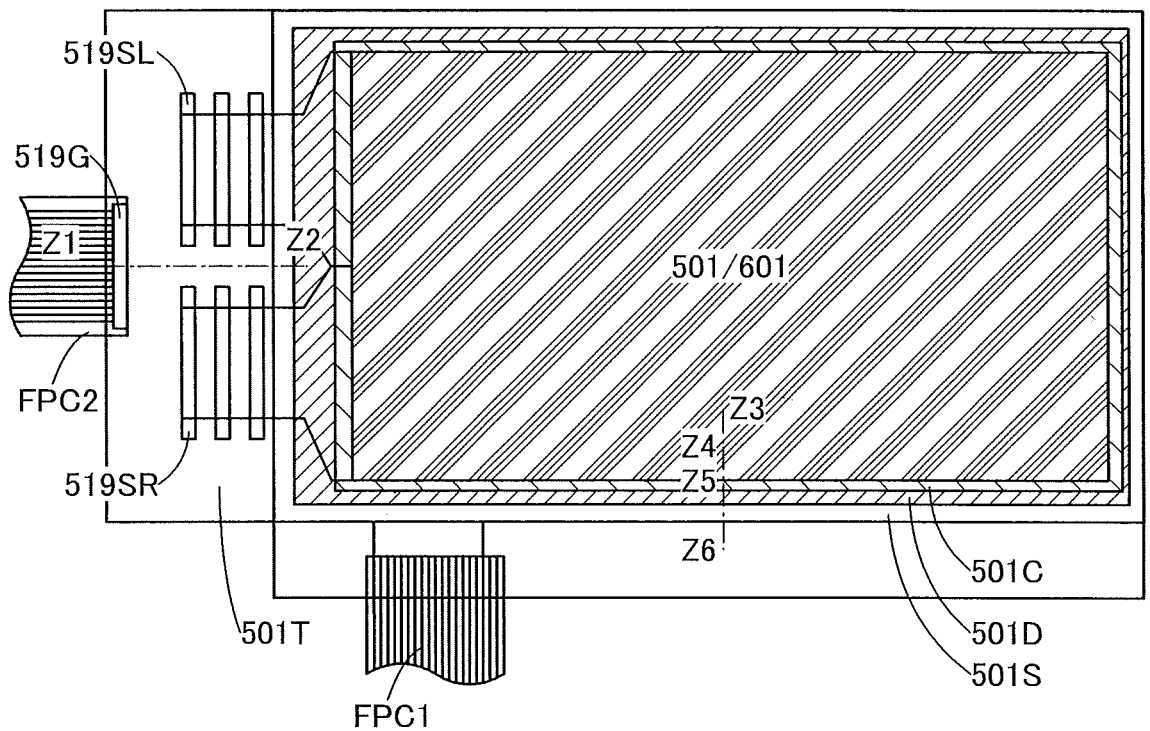
FIGS. 3A and 3B illustrate a structure of an input/output device of one embodiment.
Figure 3B:
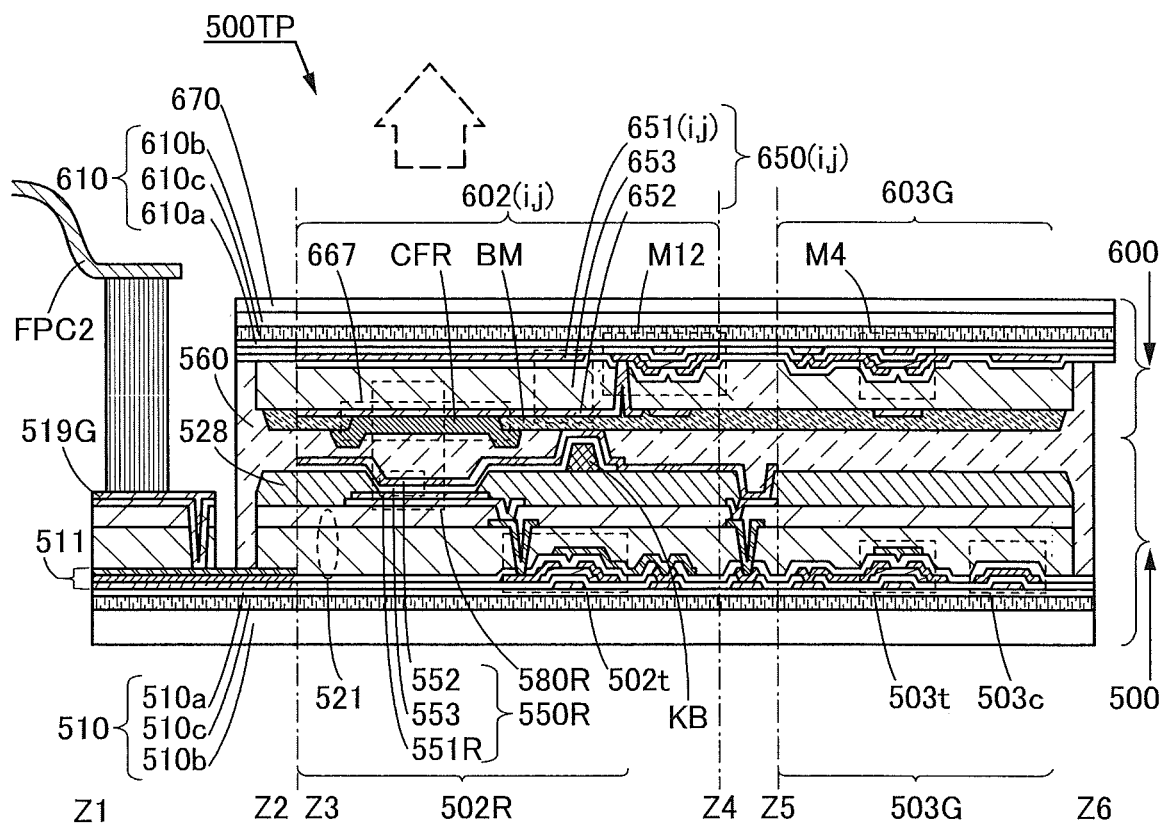

FIG. 3A is a top view of the input/output device 500TP of one embodiment of the present invention, and FIG. 3B is a cross-sectional view along lines Z1-Z2 and Z3-Z4-Z5-Z6 in FIG. 3A.

Figure 4:
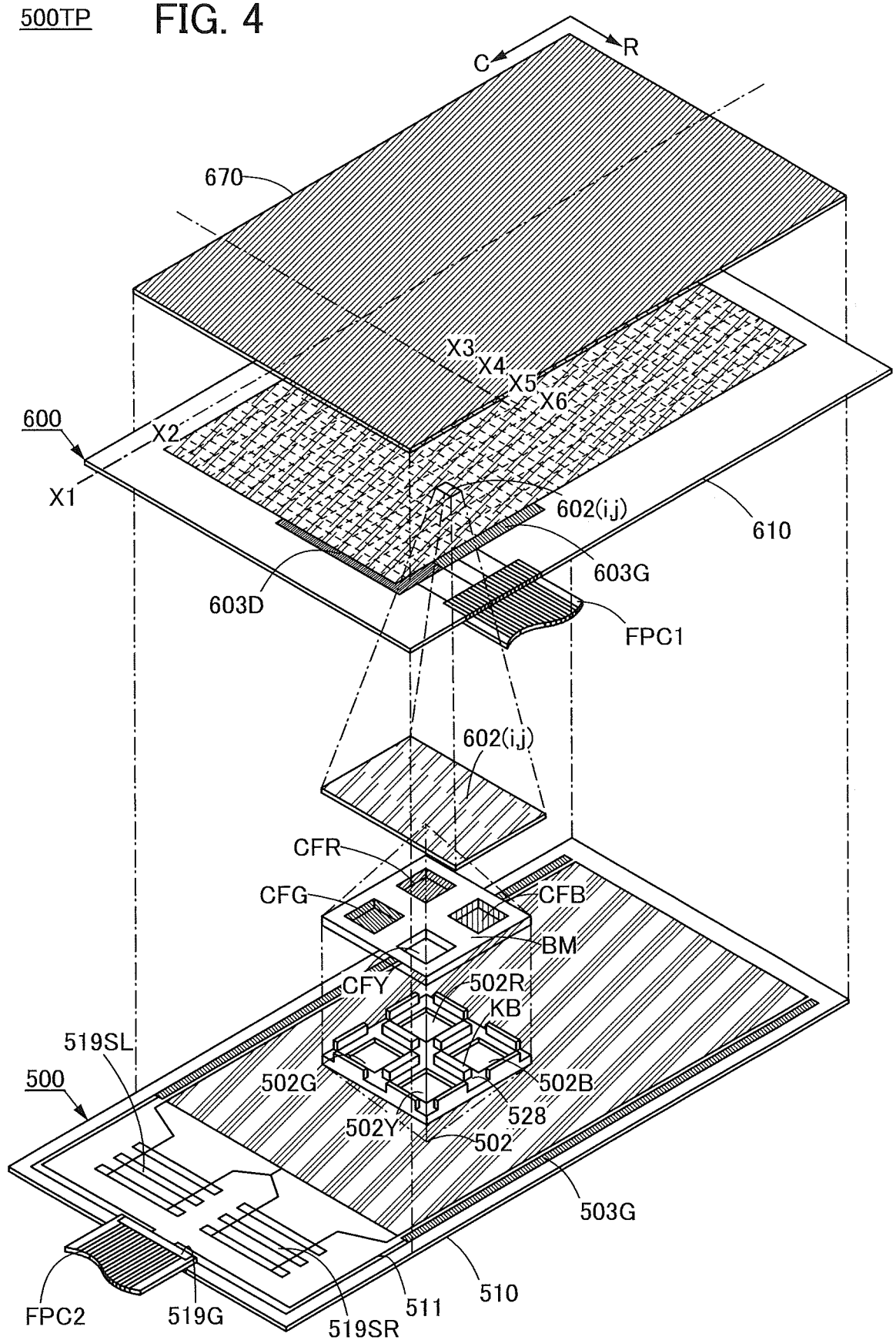
FIG. 4 illustrates a structure of an input/output device of one embodiment.

FIG. 4 is a projection view of the input/output device 500TP of one embodiment of the present invention.

Figure 5A:
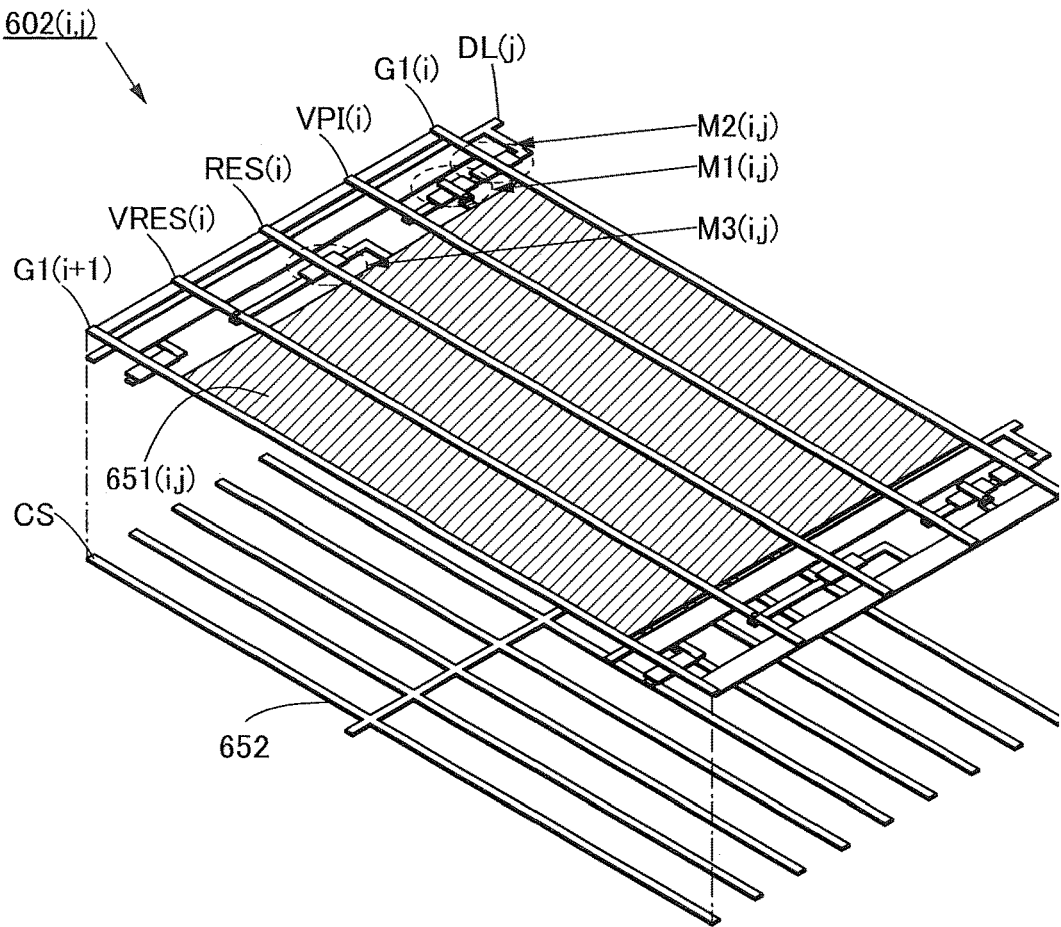
FIGS. 5A and 5B illustrate a structure of a sensing unit included in an input/output device of one embodiment.
Figure 5B:
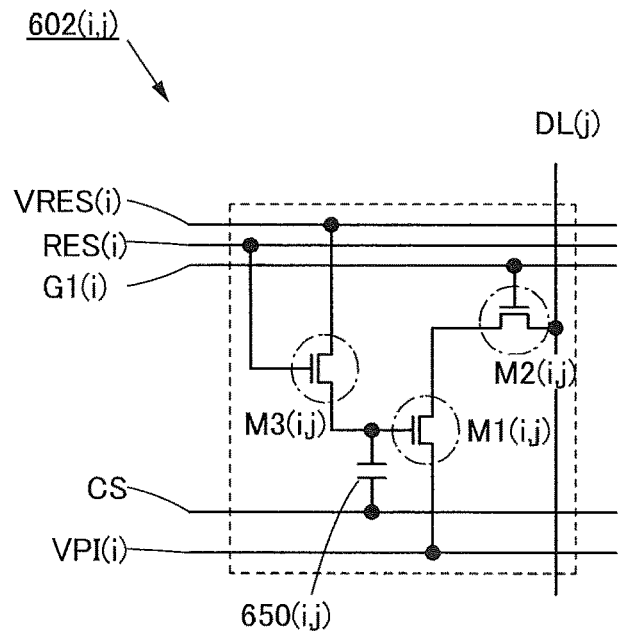

FIGS. 5A and 5B are a projection view and a circuit diagram of a sensing unit 602(i,j) included in the input/output device 500TP of one embodiment of the present invention.

<Structure Example of Input/Output Device>

The input/output device 500TP described in this embodiment includes a display portion 500, an input portion 600 overlapping with the display portion 500, a display region 501 in the display portion 500, an input region 601 arranged in the input portion 600 and overlapping with the display region 501, and a sealing region 501S surrounding the display region 501 and the input region 601 (see FIGS. 3A and 3B).

The display region 501, the input region 601, and the sealing region 501S include a first base 510 and a second base 610 (see FIG. 3B).

The display region 501 and the input region 601 include the spacer KB between the first base 510 and the second base 610.

The sealing region 501S includes a bonding layer 560 which attaches the first base 510 and the second base 610.

The display region 501 includes a plurality of pixels 502 (see FIG. 4).

The pixel 502 includes four subpixels (a subpixel 502R, a subpixel 502G, a subpixel 502B, and a subpixel 502Y) arranged in two rows and two columns.

The subpixel 502R includes a display element and a pixel circuit electrically connected to the display element. For example, a light-emitting element 550R can be used as the display element.

The input region 601 includes a plurality of sensing units 602(i,j). Note that in this specification, a component(i,j) refers to a component placed in the i-th row and the j-th column in an m×n matrix. A sensing unit placed in the i-th row and the j-th column is denoted by the sensing unit 602(i,j). One of m and n is a natural number of 1 or more, and the other is a natural number of 2 or more. Further, i is a natural number of m or less, and j is a natural number of n or less.

The sensing unit 602(i,j) includes the light-blocking layer BM having an opening 667 overlapping with the subpixel 502R, a sensing circuit overlapping with the light-blocking layer BM, and a sensing element 650(i,j) electrically connected to the sensing circuit (see FIGS. 3A and 3B, FIG. 4, and FIGS. 5A and 5B).

The aforementioned input/output device 500TP in this embodiment includes the display portion 500, the input portion 600 overlapping with the display portion 500, the display region 501 in the display portion 500, the input region 601 in the input portion 600 and overlapping with the display region 501, and the sealing region 501S surrounding the display region 501 and the input region 601. The display region 501, the input region 601, and the sealing region 501S include the first base 510 and the second base 610, and the display region 501 and the input region 601 include the spacer KB between the first base 510 and the second base 610. Consequently, the predetermined distance can be made between the first base and the second base without providing a spacer in the sealing region. As a result, a novel input/output device that is highly convenient or reliable can be provided.

In addition, the input/output device 500TP includes a region 501C on the outer side of the display region 501, a region 501D on the outer side of the region 501C, and a region 501T on the outer side of the region 501D (see FIG. 3A).

The input/output device 500TP includes a protective layer 670 having a region overlapping with the display region 501 and the input region 601.

Individual components of the input/output device 500TP will be described blow. Note that these components cannot be clearly distinguished and one component also serves as another component or includes part of another component in some cases.

For example, the input portion 600 including coloring layers in positions overlapping with a plurality of openings 667 also serves as a color filter.

Furthermore, for example, the input/output device 500TP in which the input portion 600 overlaps with the display portion 500 serves as the input portion 600 and the display portion 500. Note that the input/output device 500TP in which the input portion 600 overlaps with the display portion 500 is also referred to as a touch panel.

<<Overall Structure>>

The input/output device 500TP includes the display portion 500, the input portion 600, the display region 501, the input region 601, the sealing region 501S, the first base 510, or the second base 610.

The input/output device 500TP may also include the region 501C, the region 501D, the region 501T, or the protective layer 670.

The region 501C and the region 501D include the first base 510 and the second base 610.

The region 501C includes an opening provided in an insulating film 521.

The region 501D includes a driver circuit 503G, a driver circuit 603G, and a driver circuit 603D.

The region 501T includes a terminal 519G, a terminal 519SL, and a terminal 519SR.

<<Input Portion>>

The input portion 600 includes the sensing unit 602(i,j) or the second base 610.

The input portion 600 also includes a wiring VPI(i), a wiring CS, a scanning line G1(i), a wiring RES(i), a wiring VRES(i), or a signal line DL(j) (see FIGS. 5A and 5B). In this specification, a wiring(i) refers to a wiring placed in the i-th row and a wiring(j) refers to a wiring placed in the j-th column.

Note that the input portion 600 may be formed in such a manner that films for forming the input portion 600 are deposited over the second base 610 and the films are processed.

Alternatively, the input portion 600 may be formed in such a manner that part of the input portion 600 is formed over another base and the part is transferred to the second base 610.

<<Sensing Unit>>

The sensing unit 602(i,j) senses an object that approaches or touches the sensing unit 602 and supplies a sensing signal. For example, the sensing unit 602(i,j) senses capacitance, illuminance, magnetic force, a radio wave, pressure, or the like and supplies data based on the sensed physical quantity. Specifically, a capacitor, a photoelectric conversion element, a magnetic sensing element, a piezoelectric element, a resonator, or the like can be used as a sensing element.

The sensing unit 602(i,j) senses, for example, a change in capacitance between the sensing unit 602(i,j) and an object that approaches or touches the sensing unit 602(i,j). Specifically, a conductive film and a sensing circuit electrically connected to the conductive film may be used.

Note that when an object having a higher dielectric constant than the air, such as a finger, approaches the conductive film in the air, the electrostatic capacitance between the finger and the conductive film changes. The sensing unit $602(i,j)$ can sense the change in capacitance and supply sensing data. Specifically, a sensing circuit including a conductive film and a capacitor one electrode of which is connected to the conductive film can be used for the sensing unit $602(i,j)$.

For example, the capacitance change causes charge distribution between the capacitor and the conductive film, leading to voltage change across the capacitor. This voltage change can be used for a sensing signal.

Specifically, the capacitor is used as the sensing element $650(i,j)$. Used as the sensing signal is the potential of a first electrode $651(i,j)$, which varies with a change in the potential of a second electrode $652$ of the sensing element $650(i,j)$, the distance between a conductive film electrically connected to the first electrode $651(i,j)$ and an object approaching the conductive film, or the like.

Note that the sensing element $650(i,j)$ includes the first electrode $651(i,j)$, the second electrode $652$ overlapping with the first electrode $651(i,j)$, and a dielectric layer $653$ between the first electrode $651(i,j)$ and the second electrode $652$.

<<Sensing Circuit, Switch, and Transistor>>

Various kinds of circuits can be used as the sensing circuit. Specifically, a sensing circuit including a switch or a transistor can be used (see FIG. 5B). Note that the switch or the transistor is not necessarily provided, and a capacitor may be used in the sensing circuit or a touch sensor.

Note that a low resistance material is preferably used for a wiring or an electrode included in the touch sensor. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. In the case of using an Ag nanowire, a light transmittance of 89% or more and a sheet resistance of 40 ohm/square or more and 100 ohm/square or less can be achieved. Since such a material provides a high light transmittance, the metal nanowire, the metal mesh, a carbon nanotube, graphene, or the like may be used for an electrode of the display element, such as a pixel electrode or a common electrode.

The sensing unit $602(i,j)$ includes a switch that can be turned on or off on the basis of a control signal.

For example, switches can be a transistor $M2(i,j)$ that can be turned on or off on the basis of a second control signal and a transistor M3 that can be turned on or off on the basis of a third control signal.

A transistor $M1(i,j)$ that amplifies a sensing signal can be used in the sensing unit $602$.

Transistors that can be formed through the same process can be used as the transistor $M1(i,j)$ that amplifies a sensing signal and the switches. This allows the input portion $600$ to be manufactured through a simplified process.

The transistor includes a semiconductor layer. For example, a Group 14 element, a compound semiconductor, or an oxide semiconductor can be used for the semiconductor layer. Specifically, a semiconductor containing silicon, a semiconductor containing gallium arsenide, an oxide semiconductor containing indium, or the like can be used for the semiconductor layer. Alternatively, an organic semiconductor or the like can be used for the semiconductor layer. Examples of an organic semiconductor include acenes such as tetracene and pentacene.

Transistors can include semiconductor layers with a variety of crystallinities. For example, a semiconductor layer containing non-crystal, a semiconductor layer containing microcrystal, a semiconductor layer containing polycrystal, or a semiconductor layer containing single crystal can be used. Specifically, a semiconductor layer containing amorphous silicon, a semiconductor layer containing polysilicon obtained by crystallization process such as laser annealing, a semiconductor layer formed by a silicon on insulator (SOI) technique, and the like can be used.

The oxide semiconductor used for the semiconductor layer preferably includes, for example, a material represented by an In-M-Zn oxide that contains at least indium (In), zinc (Zn), and M (metal such as Al, Ga, Ge, Y, Zr, Sn, La, Ce, or Hf). Alternatively, both In and Zn are preferably contained.

As an oxide semiconductor included in an oxide semiconductor film, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

<<Wiring>>

The input portion $600$ includes the wiring. The wiring includes the wiring VPI(i), the wiring CS, the scanning line G1(i), the wiring RES(i), the wiring VRES(i), the signal line DL(j), or the like.

For example, the signal line DL(j) has a function of supplying a sensing signal; the wiring VPI(i), a function of supplying a ground potential; the wiring CS, a function of supplying a first control signal; the scanning line G1(i), a function of supplying a second control signal; the wiring RES(i), a function of supplying a third control signal; and the wiring VRES(i), a function of supplying a ground potential.

A conductive material can be used for the wirings and the like.

For example, an inorganic conductive material, an organic conductive material, a metal material, or a conductive ceramic material can be used for the wirings.

Specifically, a metal element selected from aluminum, gold, platinum, silver, chromium, tantalum, titanium, molybdenum, tungsten, nickel, iron, cobalt, yttrium, zirconium, palladium, and manganese; an alloy including any of the above-described metal elements; an alloy including any of the above-described metal elements in combination; or the like can be used for the wirings or the like. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, it is possible to use a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like.

Specifically, an alloy film or a nitride film in which aluminum and one or more elements selected from titanium, tantalum, tungsten, molybdenum, chromium, neodymium, and scandium are combined can be used.

Alternatively, a conductive oxide such as indium oxide, indium tin oxide, indium zinc oxide, zinc oxide, or zinc oxide to which gallium is added can be used.

Alternatively, graphene or graphite can be used. A film containing graphene can be formed, for example, by reducing a film containing graphene oxide. Examples of a reducing method include a method with application of heat and a method using a reducing agent.

Alternatively, a conductive polymer can be used.

<<Driver Circuit>>

The driver circuit 603G can supply control signals at predetermined timings, for example. Specifically, the driver circuit 603G supplies the second control signal and the third control signal to the scanning line G1(i) and the wiring RES(i), respectively, in a predetermined order.

A variety of circuits can be used as the driver circuit 603G. For example, a shift register, a flip-flop circuit, or a combination circuit can be used. For example, the driver circuit 603G may supply a selection signal to operate the input portion 600 on the basis of a predetermined operation of the display portion 500. Specifically, the selection signal may be supplied to operate the input portion 600 in a retrace period of the display portion 500. Thus, it is possible to alleviate a problem in that the input portion 600 senses noise due to the operation of the display portion 500.

The driver circuit 603D supplies sensing information in accordance with a sensing signal supplied by the sensing unit 602(i,j).

A variety of circuits can be used as the driver circuit 603D. For example, a circuit which can serve as a source follower circuit or a current mirror circuit by electrical connection with the sensing circuit provided in the sensing unit 602(i,j) can be used as the driver circuit 603D. Further, an analog/digital converter circuit which converts a sensing signal into a digital signal may be included.

<<Base>>

There is no particular limitation on the material for the base 610 as long as the base 610 has heat resistance high enough to withstand a manufacturing process and a thickness and a size which can be used in a manufacturing apparatus. In particular, use of a flexible material for the base 610 enables the input portion 600 to be folded or unfolded. Note that in the case where the input portion 600 is positioned on a side where the display portion 500 displays an image, a light-transmitting material is used for the base 610.

An organic material, an inorganic material, or a composite material of an organic material and an inorganic material can be used for the base 610.

For example, an inorganic material such as glass, ceramic, or metal can be used for the base 610.

Specifically, non-alkali glass, soda-lime glass, potash glass, crystal glass, or the like can be used for the base 610.

Specifically, a metal oxide film, a metal nitride film, a metal oxynitride film, or the like can be used for the base 610. For example, a thin film containing silicon oxide, silicon nitride, silicon oxynitride, or alumina can be used for the base 610.

For example, an organic material such as a resin, a resin film, or plastic can be used for the base 610.

Specifically, a resin film or resin plate of polyester, polyolefin, polyamide, polyimide, polycarbonate, an acrylic resin, or the like can be used for the base 610.

For example, a composite material such as a resin film to which a thin glass plate or a film of an inorganic material is attached can be used for the base 610.

For example, a composite material formed by dispersing a fibrous or particulate metal, glass, an inorganic material, or the like into a resin film can be used for the base 610.

For example, a composite material formed by dispersing a fibrous or particulate resin, an organic material, or the like into an inorganic material can be used for the base 610.

A single-layer material or a stacked-layer material including a plurality of layers can be used for the base 610. For example, a stacked-layer material including a base and an insulating layer that prevents diffusion of impurities contained in the base can be used for the base 610.

Specifically, a stacked-layer material including glass and one or a plurality of films that prevent diffusion of impurities contained in the glass, e.g., a silicon oxide film, a silicon nitride film, or a silicon oxynitride film can be used for the base 610.

Alternatively, a stacked-layer material including a resin and a film that prevents diffusion of impurities passing through the resin, such as a silicon oxide film, a silicon nitride film, or a silicon oxynitride film, can be used for the base 610.

Specifically, a stack including a flexible base 610b, a barrier film 610a preventing diffusion of impurities, and a resin layer 610c attaching the base 610b to the barrier film 610a can be used (see FIG. 3B).

<<Flexible Printed Circuit>>

A flexible printed circuit FPC1 supplies a timing signal, a power supply potential, or the like and is supplied with a sensing signal.

<<Display Portion>>

The display portion 500 includes the pixel 502, scan lines, signal lines, or the base 510 (see FIG. 4).

Note that the display portion 500 may be formed in such a manner that films for forming the display portion 500 are deposited over the base 510 and the films are processed.

The display portion 500 may also be formed in such a manner that part of the display portion 500 is formed over another base and the part is transferred to the base 510.

<<Pixel>>

The pixel 502 includes the subpixel 502B, the subpixel 502G, and the subpixel 502R, and each subpixel includes a display element and a pixel circuit for driving the display element.

<<Pixel Circuit>>

An active matrix method in which an active element is included in a pixel or a passive matrix method in which an active element is not included in a pixel can be employed for the display portion.

In the active matrix method, as an active element (a non-linear element), not only a transistor but also various active elements (non-linear elements) can be used. For example, a metal insulator metal (MIM) or a thin film diode (TFD) can also be used. Since these elements can be formed with a smaller number of manufacturing steps, manufacturing costs can be reduced or yield can be improved. Alternatively, since the size of the element is small, the aperture ratio can be improved, leading to lower power consumption or higher luminance.

As a method other than the active matrix method, the passive matrix method in which an active element (a non-linear element) is not used can also be used. Since an active element (a non-linear element) is not used, the number of manufacturing steps is small, so that manufacturing costs can be reduced or yield can be improved. Alternatively, since an active element (a non-linear element) is not used, the aperture ratio can be improved, leading to lower power consumption, higher luminance, or the like.

The pixel circuit includes, for example, a transistor 502t.

The display portion 500 includes the insulating film 521 that covers the transistor 502t. The insulating film 521 can be used as a layer for planarizing unevenness caused by the pixel circuits. A stacked-layer film including a layer that can prevent diffusion of impurities can be used as the insulating film 521. This can suppress a decrease in the reliability of the transistor 502t or the like due to diffusion of impurities.

<<Display Element>>

Various display elements can be used for the display portion 500. For example, display elements (electronic ink) that perform display by an electrophoretic method, an electronic liquid powder (registered trademark) method, an electrowetting method, or the like, MEMS shutter display elements, optical interference type MEMS display elements, and liquid crystal elements can be used.

Furthermore, a display element that can be used for a transmissive liquid crystal display, a transflective liquid crystal display, a reflective liquid crystal display, a direct-view liquid crystal display, or the like can be used. Alternatively, the display portion 500 includes at least one of an LED (e.g., a white LED, a red LED, a green LED, or a blue LED), a transistor (a transistor that emits light in accordance with current), an electron emitter, electronic ink, an electrophoretic element, a grating light valve (GLV), a plasma display panel (PDP), a digital micromirror device (DMD), a digital micro shutter (DMS), MIRASOL (registered trademark), an interferometric modulator display (IMOD) element, a piezoelectric ceramic display, and a display element including a carbon nanotube. Other than the above, a display medium whose contrast, luminance, reflectance, transmittance, or the like is changed by an electric or magnetic effect may be included. Examples of a display device having an EL element include an EL display. Examples of a display device having an electron emitter include a field emission display (FED) and an SED-type flat panel display (SED: surface-conduction electron-emitter display). Examples of a display device including electronic ink, Electronic Liquid Powder (registered trademark), or an electrophoretic element include electronic paper. Note that in the case of using an LED, graphene or graphite may be provided under an electrode or a nitride semiconductor of the LED. Graphene or graphite may be a multilayer film in which a plurality of layers are stacked. Such provision of graphene or graphite enables a nitride semiconductor layer, e.g., an n-type GaN semiconductor layer including crystals, to be easily formed thereover. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layer included in the LED may be formed by MOCVD. Note that when the graphene is provided, the GaN semiconductor layer included in the LED can also be formed by a sputtering method.

For example, organic electroluminescent elements that emit light of different colors may be included in subpixels.

For example, an organic electroluminescent element that emits white light can be used.

For example, the light-emitting element 550R includes a lower electrode 551R, an upper electrode 552, and a layer 553 containing a light-emitting organic compound between the lower electrode 551R and the upper electrode 552.

The subpixel 502R includes a light-emitting module 580R. The subpixel 502R includes the light-emitting element 550R and the pixel circuit that can supply electric power to the light-emitting element 550R and includes the transistor 502t. The light-emitting module 580R includes the light-emitting element 550R and an optical element (e.g., a coloring layer CFR).

Note that a micro resonator can be provided in the light-emitting module 580R so that light with a particular wavelength can be extracted efficiently. Specifically, a layer containing a light-emitting organic compound may be provided between a film that reflects visible light and a film that partly reflects and partly transmits visible light, which are provided so that light with a particular wavelength can be efficiently extracted.

The light-emitting module 580R includes the coloring layer CFR on the light extraction side. The coloring layer transmits light with a particular wavelength and can be, for example, a layer that selectively transmits red, green, or blue light. Note that other subpixels may be provided so as to overlap with window portions, which are not provided with the coloring layers, so that light from the light-emitting element can be emitted without passing through the coloring layers.

The coloring layer CFR overlaps with the light-emitting element 550R. Accordingly, part of light emitted from the light-emitting element 550R passes through the coloring layer CFR and is emitted to the outside of the light-emitting module 580R as indicated by an arrow in FIG. 3B The light-blocking layer BM is located so as to surround the coloring layer (e.g., the coloring layer CFR).

Note that in the case where the bonding layer 560 is provided on the light extraction side, the bonding layer 560 may be in contact with the light-emitting element 550R and the coloring layer CFR.

The lower electrode 551R is provided over the insulating film 521. A partition 528 with an opening overlapping with the lower electrode 551R is provided. Note that part of the partition 528 overlaps with an end portion of the lower electrode 551R.

The lower electrode 551R, the upper electrode 552, and the layer 553 containing a light-emitting organic compound provided therebetween form the light-emitting element (e.g., the light-emitting element 550R). The pixel circuit supplies electric power to the light-emitting element.

In addition, the spacer KB that controls the distance between the base 610 and the base 510 is provided over the partition 528.

Note that a layer having a function of reflecting visible light may be used for some or all of pixel electrodes. This offers a transflective liquid crystal display or a reflective liquid crystal display. Specifically, aluminum, silver, or the like is used for some or all of the pixel electrodes.

A memory circuit such as an SRAM can be provided under the reflective electrodes, in which case the power consumption can be further reduced. A structure suitable for employed display elements can be selected from a variety of structures of pixel circuits.

<<Base>>

A flexible material can be used for the base 510. For example, a material similar to the material that can be used for the base 610 can be used for the base 510.

Note that in the case where the base 510 does not need a light-transmitting property, for example, a non-light-transmitting material such as SUS or aluminum can be used.

For example, a stack including a flexible base 510*b*, a barrier film 510*a* that prevents diffusion of impurities, and a resin layer 510*c* attaching the barrier film 510*a* and the base 510*b* can be preferably used for the base 510 (see FIG. 3B).

<<Bonding Layer>>

The bonding layer 560 attaches the base 610 and the base 510. The bonding layer 560 has a higher refractive index than the air. In the case where light is extracted to the bonding layer 560 side, the bonding layer 560 preferably also serves as an optical adhesive layer. Specifically, a material used for the bonding layer 560 has a refractive index that is different from that of the base 510 by 0.2 or less. Alternatively, a material used for the bonding layer 560 has a refractive index that is different from that of the base 610 by 0.2 or less.

<<Structure of Driver Circuit>>

The driver circuit 503G supplies a selection signal. For example, the driver circuit 503G supplies a selection signal to the scan line.

For example, a shift register, a flip-flop circuit, or a combination circuit can be used as the driver circuit 503G or the like.

Alternatively, transistors that can be formed through the same process and over the same substrate as the pixel circuit can be used in the driver circuit.

In addition, a driver circuit supplying an image signal may be provided. For example, a component that can be formed through the same process as a transistor 503*t* or a capacitor 503*c* can be used in the driver circuit supplying an image signal.

<<Wiring>>

The display portion 500 includes wirings such as scan lines, signal lines, and power supply lines. A variety of conductive films can be used for the wirings. For example, a conductive film similar to the conductive film that can be used for the input portion 600 can be used.

The display portion 500 includes a wiring 511 through which a signal can be supplied. The wiring 511 is provided with the terminal 519G. Note that a flexible printed circuit FPC2 through which a power supply potential, a synchronization signal, or the like can be supplied is electrically connected to the terminal 519G.

Note that a printed wiring board (PWB) may be attached to the flexible printed circuit FPC2.

Furthermore, the terminal 519SL and the terminal 519SR are provided so as to supply an image signal and a synchronization signal, a power supply potential, or the like.

<<Protective Layer>>

The input/output device 500TP includes the protective layer 670 overlapping with the display region 501 and the input region 601.

For example, an antireflective layer, specifically, a circular polarizing plate can be used as the protective layer 670.

For example, a ceramic coat layer or a hard coat layer can be used as the protective layer 670. Specifically, a layer containing aluminum oxide, or a UV or electron beam curable resin can be used. This can prevent the display region 501 and the input region 601 in the input/output device 500TP from being damaged.

Note that this embodiment can be combined with the other embodiments in this specification as appropriate.

Embodiment 4

In this embodiment, a structure of an information processing device including the input/output device of one embodiment of the present invention will be described with reference to FIGS. 6A to 6C.

Figure 6A:
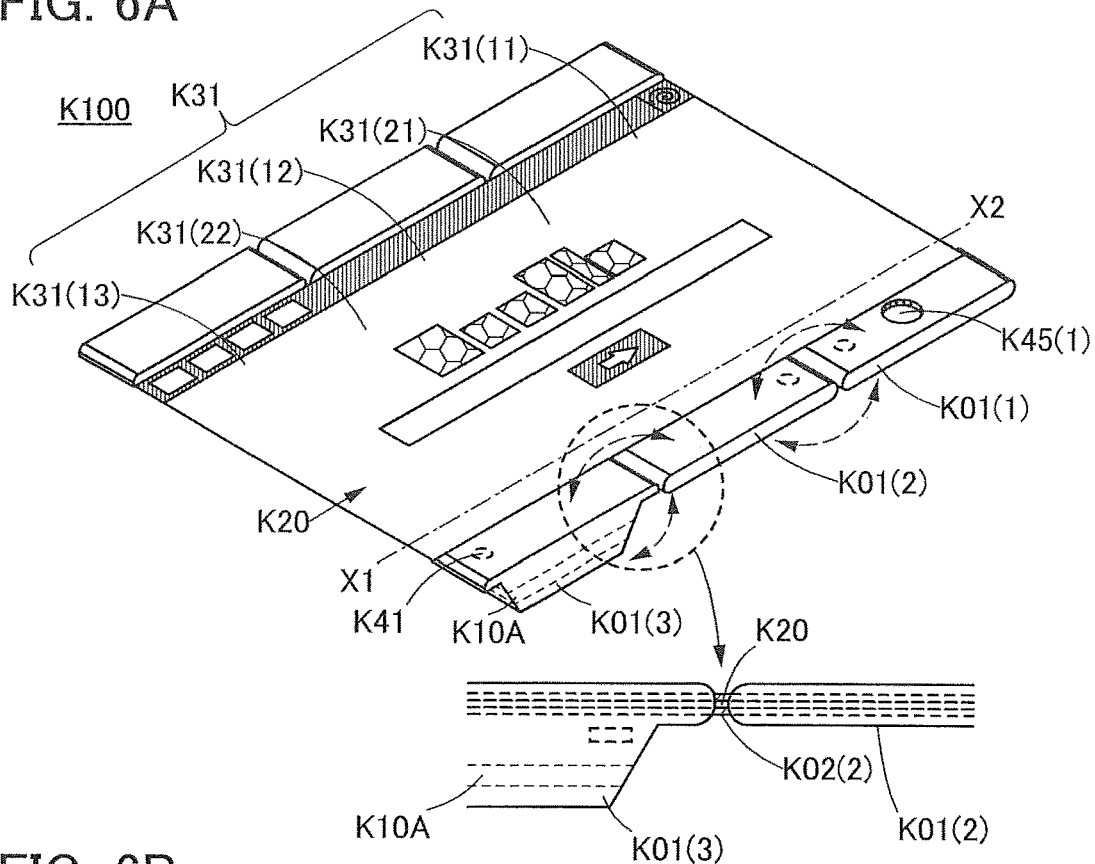
FIGS. 6A to 6C illustrate a structure of an information processing device of one embodiment.
Figure 6B:
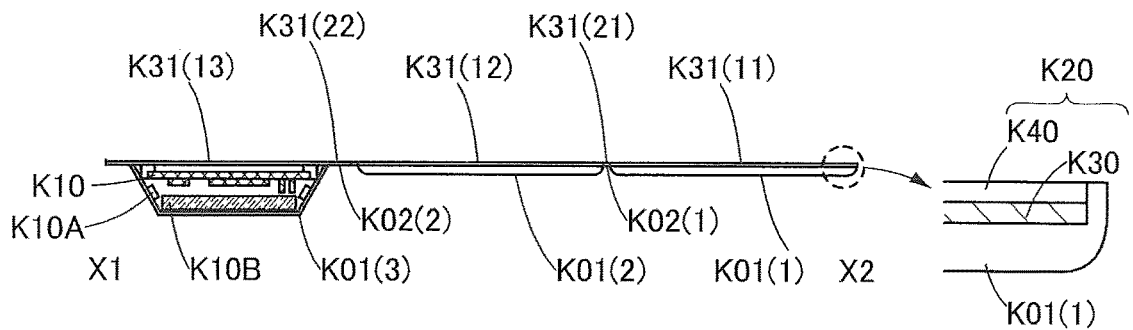
Figure 6C:
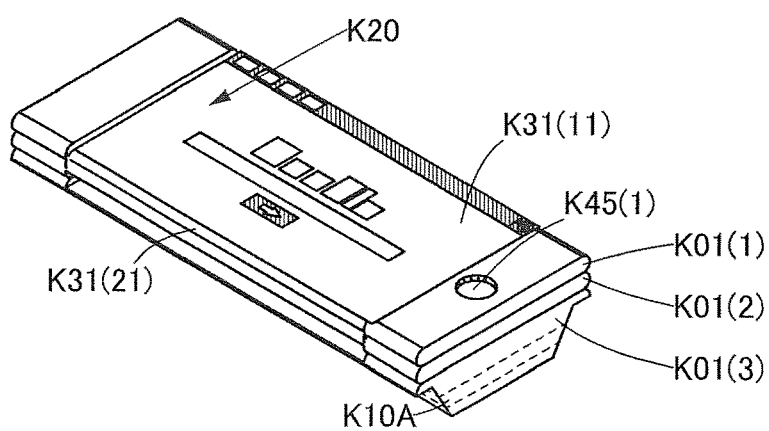

FIGS. 6A to 6C illustrate the information processing device of one embodiment of the present invention.

FIG. 6A is a projection view illustrating an input/output device K20 in an information processing device K100 of one embodiment of the present invention which is unfolded. FIG. 6B is a cross-sectional view of the information processing device K100 along line X1-X2 in FIG. 6A. FIG. 6C is a projection view illustrating the input/output device K20 which is folded.

<Structure Example of Information Processing Device>

The information processing device K100 described in this embodiment includes the input/output device K20, an arithmetic device K10, or housings K01(1) to K01(3) (see FIGS. 6A to 6C).

<<Input/Output Device>>

The input/output device K20 includes a display portion K30 and an input device K40. The input/output device K20 is supplied with image data V and supplies sensing data S (see FIG. 6B).

The display portion K30 is supplied with the image data V, and the input device K40 supplies the sensing data S.

The input/output device K20, in which the input device K40 and the display portion K30 integrally overlap with each other, serves not only as the display portion K30 but also as the input device K40.

The input/output device K20 using a touch sensor as the input device K40 and a display panel as the display portion K30 can be referred to as a touch panel.

<<Display Portion>>

The display portion K30 includes a region K31 where a first region K31(11), a first bendable region K31(21), a second region K31(12), a second bendable region K31(22), and a third region K31(13) are arranged in stripes in this order (see FIG. 6A).

The display portion K30 can be folded and unfolded along a first fold line formed in the first bendable region K31(21) and a second fold line formed in the second bendable region K31(22) (see FIGS. 6A and 6C).

<<Arithmetic Device>>

The arithmetic device K10 includes an arithmetic portion and a memory portion that stores a program to be executed by the arithmetic portion. The arithmetic device K10 supplies the image data V and is supplied with the sensing data S.

<<Housing>>

A housing includes the housing K01(1), a hinge K02(1), the housing K01(2), a hinge K02(2), or the housing K01(3) which are placed in this order.

In the housing K01(3), the arithmetic device K10 is stored. The housings K01(1) to K01(3) hold the input/output device K20, and enable the input/output device K20 to be folded or unfolded (see FIG. 6B).

In this embodiment, the information processing device including the three housings and the two hinges connecting the three housings is given as an example. The input/output device K20 in this information processing device can be bent at the positions with the two hinges.

Note that n (n is a natural number greater than or equal to 2) housings can be connected using (n−1) hinges. The information processing device having such a structure can be folded while the input/output device K20 is bent at (n−1) positions.

The housing K01(1) overlaps with the first region K31(11) and is provided with a button K45(1).

The housing K01(2) overlaps with the second region K31(12).

The housing K01(3) overlaps with the third region K31(13) and stores the arithmetic device K10, an antenna K10A, and a battery K10B.

The hinge K02(1) overlaps with the first bendable region K31(21) and connects the housing K01(1) rotatably to the housing K01(2).

The hinge K02(2) overlaps with the second bendable region K31(22) and connects the housing K01(2) rotatably to the housing K01(3).

The antenna K10A is electrically connected to the arithmetic device K10 and supplies a signal or is supplied with a signal.

In addition, the antenna K10A is wirelessly supplied with power from an external device and supplies power to the battery K10B.

The battery K10B is electrically connected to the arithmetic device K10 and supplies power or is supplied with power.

<<Folding Sensor>>

A folding sensor K41 determines whether the housing is folded or unfolded and supplies data showing the state of the housing.

The data showing the state of the housing is supplied to the arithmetic device K10.

In the case where the data showing the state of the housing K01 is data showing a folded state, the arithmetic device K10 supplies the image data V including a first image to the first region K31(11) (see FIG. 6C).

In the case where the data showing the state of the housing K01 is data showing an unfolded state, the arithmetic device K10 supplies the image data V to the region K31 of the display portion K30 (see FIG. 6A).

Note that this embodiment can be combined with any of the other embodiments in this specification as appropriate.

Embodiment 5

In this embodiment, a structure of an information processing device in which the input/output device of one embodiment of the present invention is used in an input/output portion will be described with reference to FIGS. 7A1, 7A2, 7A3, 7B1, 7B2, 7C1, and 7C2.

FIGS. 7A1, 7A2, 7A3, 7B1, 7B2, 7C1, and 7C2 illustrate information processing devices of one embodiment of the present invention.

FIGS. 7A1 to 7A3 are projection views illustrating an information processing device of one embodiment of the present invention.

FIGS. 7B1 and 7B2 are projection views illustrating an information processing device of one embodiment of the present invention.

FIGS. 7C1 and 7C2 are a top view and a bottom view illustrating an information processing device of one embodiment of the present invention.

<<Information Processing Device A>>

An information processing device 3000A includes an input/output portion 3120 and a housing 3101 supporting the input/output portion 3120 (see FIGS. 7A1 to 7A3).

The information processing device 3000A further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000A can display information on its side surface and/or top surface.

A user of the information processing device 3000A can supply operation instructions by using a finger in contact with the side surface and/or the top surface.

<<Information Processing Device B>>

An information processing device 3000B includes the input/output portion 3120 and an input/output portion 3120*b* (see FIGS. 7B1 and 7B2).

The information processing device 3000B further includes the housing 3101 and a belt-shaped flexible housing 3101*b* that support the input/output portion 3120.

The information processing device 3000B further includes the housing 3101 supporting the input/output portion 3120*b*.

The information processing device 3000B further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000B can display data on the input/output portion 3120 supported by the belt-shaped flexible housing 3101*b*.

A user of the information processing device 3000B can supply operation instructions by using a finger in contact with the input/output portion 3120.

<<Information Processing Device C>>

An information processing device 3000C includes the input/output portion 3120 and the housings 3101 and 3101*b* supporting the input/output portion 3120 (see FIGS. 7C1 and 7C2).

The input/output portion 3120 and the housing 3101*b* have flexibility.

The information processing device 3000C further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The information processing device 3000C can be folded in two at the housing 3101*b*.

Note that this embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial No. 2014-151604 filed with Japan Patent Office on Jul. 25, 2014, the entire contents of which are hereby incorporated by reference.

What is claimed is:

1. A process for manufacturing a semiconductor device, comprising:
    preparing a first base on which a first partition and a second partition are formed;
    forming a first spacer and a second spacer on the respective first and second partitions;
    preparing a second base on which a first light blocking layer and a second light blocking layer are formed;
    forming a bonding layer over the light blocking layers on the second base;
    arranging the second base over the first base such that the first and the second light blocking layers overlap with the respective first and second partitions and with the respective first and second spacers provided therebetween;
    setting a first environment, wherein the bonding layer is not in contact with the first base before arranging the first base and the second base in the first environment;
    setting a second environment, wherein gas pressure in the second environment is higher than gas pressure in the first environment, and wherein the bonding layer is in contact with the first base and the second base after setting the second environment; and
    curing the bonding layer;
    wherein, during the manufacturing process, the semiconductor device comprises one region with a first region, a second region, and a third region within said one region,
    wherein the first region is an active device region, the first region includes the first spacer,
    wherein the second region is a terminal portion for accessing the active device, the second region does not include a spacer,
    wherein the third region is a sacrificial border which surrounds the first and the second regions during the manufacturing process, the third region includes the second spacer, and
    wherein the first and second spacers are configured to provide structural stability to said one region during the manufacturing process.

2. The method according to claim 1, wherein the gas pressure in the second environment is an atmospheric pressure.

3. The method according to claim 1, wherein the bonding layer is expanded between the first base and the second base after setting the second environment.

4. The method according to claim 1, further comprising: separating the third region from the second region.

5. The method according to claim 4, further comprising: exposing the terminal portion,
    wherein the semiconductor device comprises a light-emitting element and a wiring electrically connected to the light-emitting element and the terminal portion.

6. The method according to claim 1,
    wherein the first base comprises a first substrate, a first film, and a second film,
    wherein the first spacer and the second spacer are formed over the second film,
    wherein the first film comprises silicon, nitrogen and oxygen, and
    wherein the second film comprises tungsten.

7. The method according to claim 1,
    wherein the second base comprises a first substrate, a first film, and a second film,
    wherein the first film comprises silicon, nitrogen and oxygen, and
    wherein the second film comprises tungsten.

8. A process for manufacturing a semiconductor device, comprising:
    preparing a first base on which a first partition and a second partition are formed;
    forming a first spacer and a second spacer on the respective first and second partitions;
    preparing a second base on which a first light blocking layer and a second light blocking layer are formed;
    forming a bonding layer over the light blocking layers on the second base;
    arranging the second base over the first base such that the first and the second light blocking layers overlap with the respective first and second partitions and with the respective first and second spacers provided therebetween;
    setting a first environment, wherein the bonding layer is not in contact with the first base before arranging the first base and the second base in the first environment;
    setting a second environment, wherein gas pressure in the second environment is higher than gas pressure in the first environment, and wherein the bonding layer is in contact with the first base and the second base after setting the second environment; and
    curing the bonding layer,
    wherein, during the manufacturing process, the semiconductor device comprises one region with a first region, a second region, and a third region within said one region,
    wherein the bonding layer is included in the first region, the second region and the third region,
    wherein the first region is an active device region, the first region includes the first spacer,
    wherein the second region includes a terminal portion for accessing the active device, the second region does not include a spacer,
    wherein the third region is a sacrificial border which surrounds the first and second regions during the manufacturing process, the third region includes the second spacer, and
    wherein the first and second spacers are configured to provide structural stability to said one region during the manufacturing process.

9. The method according to claim 8,
    wherein the first base comprises a first substrate, a first film, and a second film,
    wherein the first spacer and the second spacer are formed over the second film, wherein the first film comprises silicon, nitrogen and oxygen, and wherein the second film comprises tungsten.

10. The method according to claim 8, wherein the second base comprises a first substrate, a first film, and a second film, wherein the first film comprises silicon, nitrogen and oxygen, and wherein the second film comprises tungsten.

11. The method according to claim 8, further comprising:

separating the third region from the second region.

12. A process method for manufacturing a semiconductor device, comprising:

preparing a first base on which a first partition and a second partition are formed;

forming a first spacer and a second spacer on the respective first and second partitions;

preparing a second base on which a first light blocking layer and a second light blocking layer are formed;

forming a bonding layer over the light blocking layers on the second base;

arranging the second base over the first base such that the first and the second light blocking layers overlap with the respective first and second partitions and with the respective first and second spacers provided therebetween;

setting a first environment, wherein the bonding layer is not in contact with the first base before arranging the first base and the second base in the first environment;

setting a second environment, wherein gas pressure in the second environment is higher than gas pressure in the first environment, and wherein the bonding layer is in contact with the first base and the second base after setting the second environment;

curing the bonding layer; and exposing a terminal portion, wherein, during the manufacturing process, the semiconductor device comprises one region with a first region, a second region, and a third region within said one region, wherein the first region is an active device region, the first region includes the first spacer, wherein the terminal portion is included in the second region for accessing the active device, the second region does not include a spacer, wherein the third region is a sacrificial border which surrounds the first and second regions during the manufacturing process, the third region includes the second spacer wherein the bonding layer is included in the first region, the second region and the third region, and wherein the first and second spacers are configured to provide structural stability to said one region during the manufacturing process.

\* \* \* \* \*